US011838072B2

(12) United States Patent
Tan et al.

(10) Patent No.: US 11,838,072 B2
(45) Date of Patent: Dec. 5, 2023

(54) TECHNIQUES FOR ACCURATE CABLE LOSS MEASUREMENT

(71) Applicant: QUALCOMM Incorporated, San Diego, CA (US)

(72) Inventors: Cheng Tan, Denver, CO (US); Lei Sun, Irvine, CA (US); Sean Vincent Maschue, Encinitas, CA (US); Bruce Charles Fischer, Jr., Lafayette, CO (US); Brian French, Boulder, CO (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/486,745

(22) Filed: Sep. 27, 2021

(65) Prior Publication Data

US 2023/0098404 A1   Mar. 30, 2023

(51) Int. Cl.
*H04B 3/48* (2015.01)
*H03F 3/24* (2006.01)

(52) U.S. Cl.
CPC ............. *H04B 3/48* (2013.01); *H03F 3/245* (2013.01); *H03F 2200/451* (2013.01)

(58) Field of Classification Search
CPC .. H04B 3/48; H04B 2001/0416; H04B 1/126; H04B 1/0458; H04B 1/3822; H03F 2200/451
See application file for complete search history.

(56) References Cited

U.S. PATENT DOCUMENTS

| 2012/0274398 | A1* | 11/2012 | Alavi | H03G 3/3052 330/278 |
| 2017/0324431 | A1* | 11/2017 | Solan | H03G 3/3036 |
| 2018/0270768 | A1* | 9/2018 | Morhart | H03G 3/3042 |
| 2021/0013922 | A1* | 1/2021 | Watanabe | H04B 1/44 |
| 2021/0022092 | A1* | 1/2021 | Walkowiak | H01Q 23/00 |
| 2021/0152206 | A1* | 5/2021 | Heo | H04B 1/40 |

OTHER PUBLICATIONS

R4-168241, "A-MPR simulation assumptions based on European regulation for LTE-based V2X UE", 3GPP TSG RAN WG 4 80BIS meeting R4, LG Electronics, Ljubljana, Slovenia, Oct. 10-14, 2016 (Year: 2016).*
Thomas Adam, Swen Kopp, Steffen Lang and Andreas Winkelmann, V2X—An important building block in Cooperative Intelligent Transport Systems (C-ITS), TE Automotive Wireless, TE Connectivity White Paper (Year: 2019).*
R4-2011707, "CR for TR38.886: Correction on TR38.886 for V2X UE TX and RX requirements", LG Electronics, Huawei, CATT, 3GPP TSG-WG4 Meeting #96-e, Aug. 17-28, 2020). (Year: 2020).*

* cited by examiner

*Primary Examiner* — Aristocratis Fotakis
(74) *Attorney, Agent, or Firm* — Patterson & Sheridan, L.L.P.

(57) ABSTRACT

Certain aspects of the present disclosure provide techniques for determining a cable loss associated with a transmission cable of an apparatus. An example method includes sending, to a radio modem of the apparatus, a request for the radio modem to use a target power when sending one or more signals to the signal compensator device for determining a cable loss associated with a transmission cable communicatively coupling the radio modem with the signal compensator device, receiving, at a signal compensator device of the apparatus, the one or more signals from the radio modem sent using the target power, and determining the cable loss associated with the transmission cable based on the one or more signals.

22 Claims, 10 Drawing Sheets

FIG. 7

TECHNIQUES FOR ACCURATE CABLE LOSS MEASUREMENT

INTRODUCTION

Aspects of the present disclosure relate to wireless communications, and more particularly, to techniques for determining a cable loss associated with a transmission cable in an apparatus.

Wireless communication systems are widely deployed to provide various telecommunication services such as telephony, video, data, messaging, broadcasts, or other similar types of services. These wireless communication systems may employ multiple-access technologies capable of supporting communication with multiple users by sharing available system resources with those users (e.g., bandwidth, transmit power, or other resources). Multiple-access technologies can rely on any of code division, time division, frequency division orthogonal frequency division, single-carrier frequency division, or time division synchronous code division, to name a few. These and other multiple access technologies have been adopted in various telecommunication standards to provide a common protocol that enables different wireless devices to communicate on a municipal, national, regional, and even global level.

Although wireless communication systems have made great technological advancements over many years, challenges still exist. For example, complex and dynamic environments can still attenuate or block signals between wireless transmitters and wireless receivers, undermining various established wireless channel measuring and reporting mechanisms, which are used to manage and optimize the use of finite wireless channel resources. Consequently, there exists a need for further improvements in wireless communications systems to overcome various challenges.

SUMMARY

Certain aspects can be implemented in a method for determining a cable loss. The method includes sending, to a radio modem of an apparatus, a request for the radio modem to use a target power when sending one or more signals to the signal compensator device for determining a cable loss associated with a transmission cable communicatively coupling the radio modem with the signal compensator device, receiving, at a signal compensator device of the apparatus, the one or more signals from the radio modem sent using the target power, wherein: the one or more signals are received by the signal compensator device at an input power, and the input power comprises the target power minus reduced according to the cable loss associated with the transmission cable, and determining the cable loss associated with the transmission cable based on the one or more signals.

Certain aspects can be implemented in an apparatus for determining a cable loss. The apparatus may include a memory comprising executable instructions and one or more processors configured to execute the executable instructions and cause the apparatus to: send, to a radio modem of the apparatus, a request for the radio modem to use a target power when sending one or more signals to a signal compensator device of the apparatus for determining a cable loss associated with a transmission cable communicatively coupling the radio modem with the signal compensator device, receive, at the signal compensator device, the one or more signals from the radio modem sent using the target power, wherein: the one or more signals are received by the signal compensator device at an input power, and the input power comprises the target power minus reduced according to the cable loss associated with the transmission cable, and determine the cable loss associated with the transmission cable based on the one or more signals.

Certain aspects can be implemented in an apparatus for determining a cable loss. The apparatus may include means for sending, to a radio modem of the apparatus, a request for the radio modem to use a target power when sending one or more signals to the signal compensator device for determining a cable loss associated with a transmission cable communicatively coupling the radio modem with a signal compensator device of the apparatus, means for receiving, at the signal compensator device, the one or more signals from the radio modem sent using the target power, wherein: the one or more signals are received by the signal compensator device at an input power, and the input power comprises the target power minus reduced according to the cable loss associated with the transmission cable, and means for determining the cable loss associated with the transmission cable based on the one or more signals.

Certain aspects can be implemented in a non-transitory computer-readable medium. The non-transitory computer-readable medium may include executable instructions that, when executed by one or more processors of an apparatus, cause the apparatus to: send, to a radio modem of the apparatus, a request for the radio modem to use a target power when sending one or more signals to a signal compensator device of the apparatus for determining a cable loss associated with a transmission cable communicatively coupling the radio modem with the signal compensator device, receive, at the signal compensator device, the one or more signals from the radio modem sent using the target power, wherein: the one or more signals are received by the signal compensator device at an input power, and the input power comprises the target power minus reduced according to the cable loss associated with the transmission cable, and determine the cable loss associated with the transmission cable based on the one or more signals.

Certain aspects can be implemented in a computer program product. The computer program product may be embodied on a computer-readable storage medium and may comprising code for: sending, to a radio modem of an apparatus, a request for the radio modem to use a target power when sending one or more signals to a signal compensator device of the apparatus for determining a cable loss associated with a transmission cable communicatively coupling the radio modem with the signal compensator device, receiving, at a signal compensator device, the one or more signals from the radio modem sent using the target power, wherein: the one or more signals are received by the signal compensator device at an input power, and the input power comprises the target power minus reduced according to the cable loss associated with the transmission cable, and determining the cable loss associated with the transmission cable based on the one or more signals.

Other aspects provide: an apparatus operable, configured, or otherwise adapted to perform the aforementioned methods as well as those described elsewhere herein; a non-transitory, computer-readable media comprising instructions that, when executed by one or more processors of an apparatus, cause the apparatus to perform the aforementioned methods as well as those described elsewhere herein; a computer program product embodied on a computer-readable storage medium comprising code for performing the aforementioned methods as well as those described elsewhere herein; and an apparatus comprising means for performing the aforementioned methods as well as those described elsewhere herein. By way of example, an apparatus may comprise a processing system, a device with a processing system, or processing systems cooperating over one or more networks.

The following description and the appended figures set forth certain features for purposes of illustration.

BRIEF DESCRIPTION OF THE DRAWINGS

The appended figures depict certain features of the various aspects described herein and are not to be considered limiting of the scope of this disclosure.

FIG. 7 illustrates an example additional maximum power reduction table.

DETAILED DESCRIPTION

Figure 1:
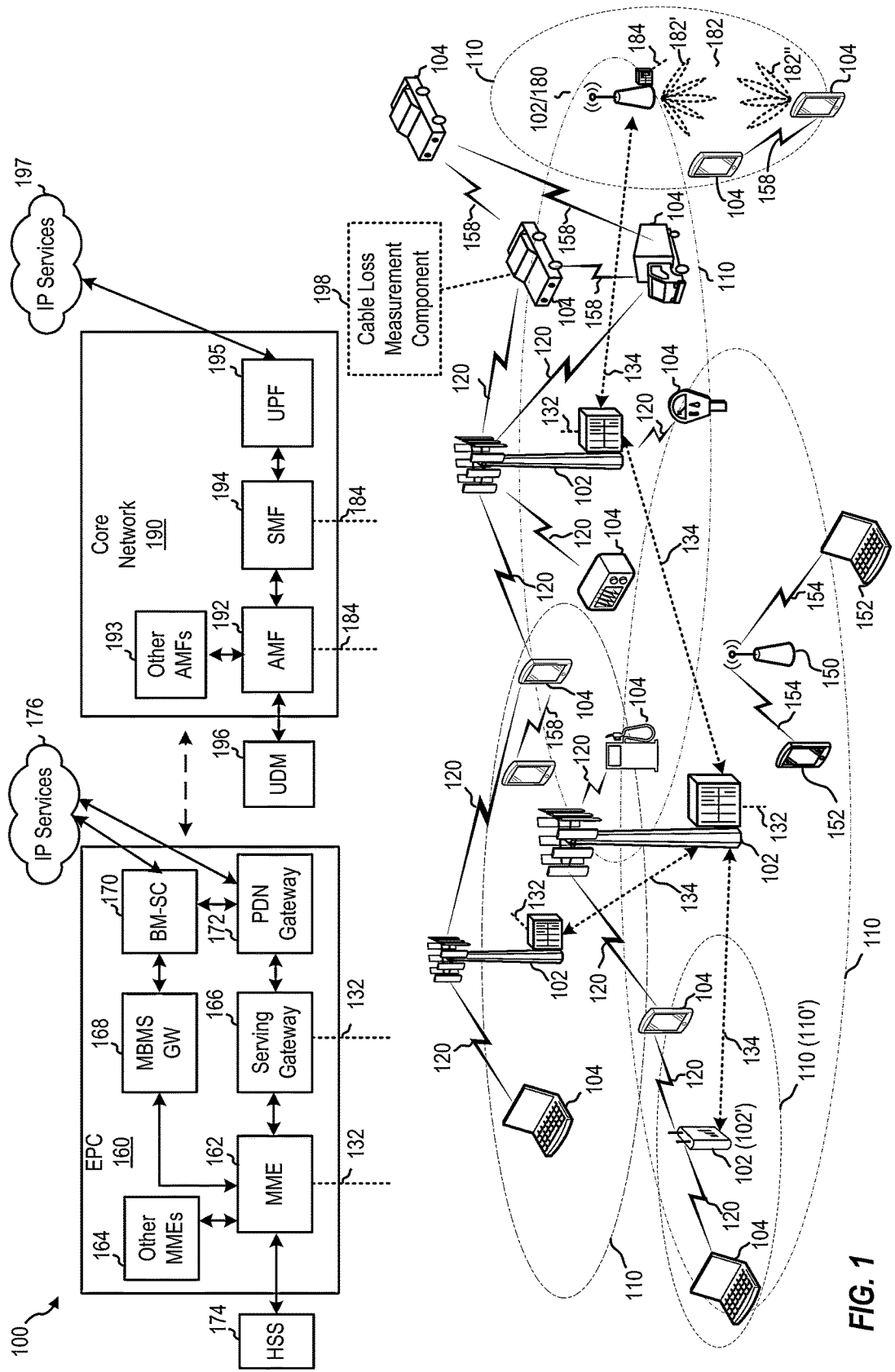
FIG. 1 is a block diagram conceptually illustrating an example wireless communication network.

Aspects of the present disclosure provide apparatuses, methods, processing systems, and computer-readable mediums for determining a cable loss associated with a transmission cable of an apparatus, such as a user equipment (UE) or vehicle that incorporates functionality of a UE.

In some cases, a vehicle may be capable of cellular communications within a wireless network. To facilitate these communications, a vehicle may include a telematics control unit (TCU). The TCU may be configured to manage many different types of communication, such as code division multiple access (CDMA) communication, third generation (3G) evolution data (EV-DO) communication, fourth generation (4G) long term evolution (LTE) communication, fifth generation (5G) new radio (NR) communication, global positioning system (GPS) communication, wide local area network (WLAN) communication, and the like. This communication may be enabled via a radio modem in the TCU, which handles modulation/demodulation, encoding/decoding, and power amplification of signals for wireless communication via one or more antennas.

In some cases, the one or more antennas may be located on different portions of the vehicle. For example, in some cases, the vehicle may include an antenna located towards the rear of the vehicle and an antenna located toward the front of the vehicle. Further, due to regulatory restrictions and/or manufacturer preference, the TCU in many cases may be located within a trunk or the rear portion of the vehicle. As a result, the antenna located near the front portion of the vehicle may need to be communicatively coupled with the TCU in the rear portion of the vehicle using a relatively long transmission cable.

This transmission cable may be associated with a particular cable loss, which can negatively affect a transmission power of signals sent for transmission to the antenna on the front portion of the vehicle via the transmission cable. For example, when signals are sent via the transmission cable, a transmission power associated with these signals may be reduced according to the transmission cable's associated cable loss. As a result, in many cases, a signal compensator device may be included at an end of the transmission cable (e.g., opposite to the TCU) and configured to amplify the transmission power of the signals to account for the cable loss associated with the transmission cable.

In order ensure that the signals are amplified properly to account for this cable loss, the cable loss must be known to the signal compensator device. Accordingly, the signal compensator device may be able to determine the cable loss associated with the transmission cable by performing cable loss measurements. These cable loss measurements typically involve the radio modem of the TCU outputting signals at a transmission power known or expected by the signal compensator device. Because the signal compensator device knows the transmission power of these signals ahead of time, the signal compensator device can simply measure an input power at which these signals are received by the signal compensator device and determine the different between this input power and the transmission power at which the signals are sent by the radio modem.

However, in certain cases, the vehicle may operate in a certain geographical area in which the radio modem is required to abide by certain power restrictions or constraints. These power constraints may require the radio modem, in some cases, to reduce or cap the transmission power at which the vehicle emits transmissions. How much the radio modem is required to reduce the transmission power or at what transmission power the radio modem is capped depends on various criteria, such as a channel over which the signals will be transmitted, a total number of resource blocks (RBs) that will be occupied by the signals, a starting RB associated with the signals, and a peak antenna gain an antenna used to transmit the signals. As such, the transmission power used for transmitting signals may vary for signal to signal depending on these criteria.

This varying transmission power presents issues with performing cable loss measurements as, when the radio modem is subject these power constraints, the signal compensator device may not know the transmission power at which the radio modem is transmitting signals. In other words, because the signal compensator device is unaware of the exact transmission power being used by the radio modem to transmit signals, the signal compensator device is unable to accurately determine the cable loss associated with the transmission cable that communicatively couples the signal compensator device with the radio modem. Not knowing or not being able to accurately account for this cable loss can lead to negative effects, such as signals being transmitted at sub-optimal transmission powers, leading to these signals not being received by intended recipients. This, in turn, leads to wasted time and frequency resources within the wireless network as these signals may need to be retransmitted in order to be received by their intended recipients, as well as wasted processing and power receives at the vehicle having to perform such retransmissions.

Accordingly, aspects of the present disclosure provide techniques for accurately performing cable loss measurement in apparatuses (e.g., vehicles) that include relatively long transmission cables and that are subject to certain power constraints in certain geographical regions. In some cases, such techniques may involve requesting a radio modem of the apparatus to use a particular target power (e.g., target transmission power), when sending one or more signals to the signal compensator device of the apparatus, that is less than or equal to a lowest transmission power specified by the power constraints associated with the geographical region. By requesting the radio modem send the one or more signals at this particular target power, it can be ensured that the radio modem will not be subject to the power constrains and, as a result, not vary the transmission power of the one or more signals.

In other words, this target power allows the radio modem to send the one or more signals to the signal compensator device at a known, fixed transmission power, which, in turn, allows the signal compensator device to accurately measure the cable loss associated with the transmission cable. By accurately measuring the cable loss, the signal compensator device is able to ensure that the one or more signals are transmitted according to an optimal transmission power intended by the radio modem, thereby reducing the chances that these signals need to be retransmitted and therefore reducing the wasted time, frequency, power, and processing resources described above.

Introduction to Wireless Communication Networks

FIG. 1 depicts an example of a wireless communications system 100, in which aspects described herein may be implemented.

Generally, wireless communications system 100 includes wireless devices 102, user equipments (UEs) 104, one or more core networks, such as an Evolved Packet Core (EPC) 160 and 5G Core (5GC) network 190, which interoperate to provide wireless communications services. In some cases, the wireless devices 102 may comprise a base station (BS) or roadside unit (RSU).

Wireless devices 102 may provide an access point to the EPC 160 and/or 5GC 190 for a UE 104, and may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, delivery of warning messages, among other functions. Base stations may include and/or be referred to as a gNB, NodeB, eNB, ng-eNB (e.g., an eNB that has been enhanced to provide connection to both EPC 160 and 5GC 190), an access point, a base transceiver station, a radio base station, a radio transceiver, or a transceiver function, or a transmission reception point in various contexts.

Wireless devices 102 wirelessly communicate with UEs 104 via communications links 120. Each of the wireless devices 102 may provide communication coverage for a respective geographic coverage area 110, which may overlap in some cases. For example, small cell 102' (e.g., a low-power base station) may have a coverage area 110' that overlaps the coverage area 110 of one or more macrocells (e.g., high-power base stations).

The communication links 120 between wireless devices 102 and UEs 104 may include uplink (UL) (also referred to as reverse link) transmissions from a UE 104 to a wireless device 102 and/or downlink (DL) (also referred to as forward link) transmissions from a wireless device 102 to a UE 104. The communication links 120 may use multiple-input and multiple-output (MIMO) antenna technology, including spatial multiplexing, beamforming, and/or transmit diversity in various aspects.

Examples of UEs 104 include a cellular phone, a smart phone, a session initiation protocol (SIP) phone, a laptop, a personal digital assistant (PDA), a satellite radio, a global positioning system, a multimedia device, a video device, a digital audio player, a camera, a game console, a tablet, a smart device, a wearable device, a vehicle, an electric meter, a gas pump, a large or small kitchen appliance, a healthcare device, an implant, a sensor/actuator, a display, or other similar devices. Some of UEs 104 may be internet of things (IoT) devices (e.g., parking meter, gas pump, toaster, vehicles, heart monitor, or other IoT devices), always on (AON) devices, or edge processing devices. UEs 104 may also be referred to more generally as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, or a client.

Communications using higher frequency bands may have higher path loss and a shorter range compared to lower frequency communications. Accordingly, certain base stations (e.g., BS 180 in FIG. 1) may utilize beamforming 182 with a UE 104 to improve path loss and range. For example, BS 180 and the UE 104 may each include a plurality of antennas, such as antenna elements, antenna panels, and/or antenna arrays to facilitate the beamforming.

In some cases, BS 180 may transmit a beamformed signal to UE 104 in one or more transmit directions 182'. UE 104 may receive the beamformed signal from the BS 180 in one or more receive directions 182". UE 104 may also transmit a beamformed signal to the base station 180 in one or more transmit directions 182". Base station 180 may also receive the beamformed signal from UE 104 in one or more receive directions 182'. Base station 180 and UE 104 may then perform beam training to determine the best receive and transmit directions for each of BS 180 and UE 104. Notably, the transmit and receive directions for BS 180 may or may not be the same. Similarly, the transmit and receive directions for UE 104 may or may not be the same.

Figure 8:
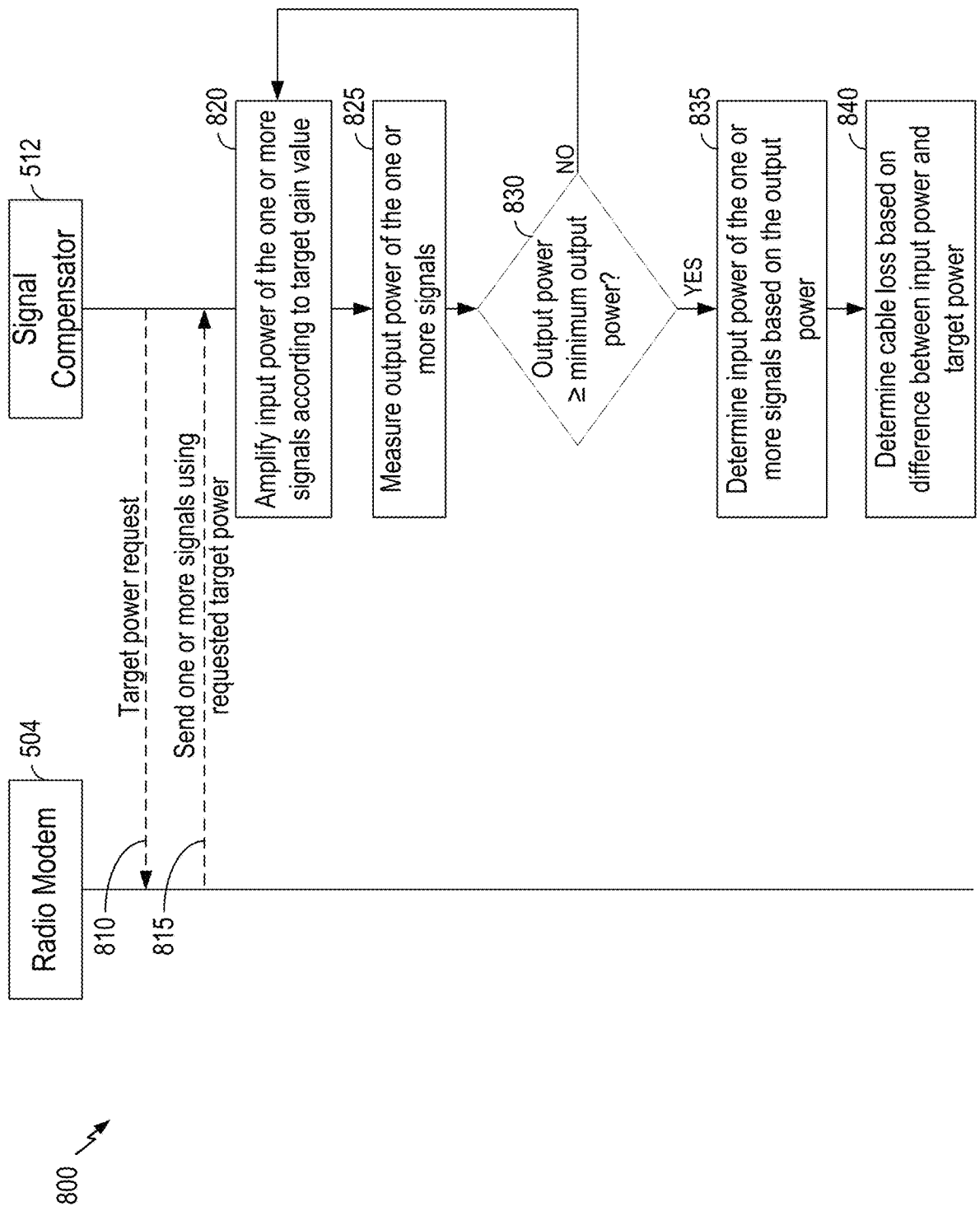
FIG. 8 is a call flow diagram illustrating example operations performed by a radio modem and a signal compensator device of a vehicle for determining a cable loss associated with a transmission cable.
Figure 9:
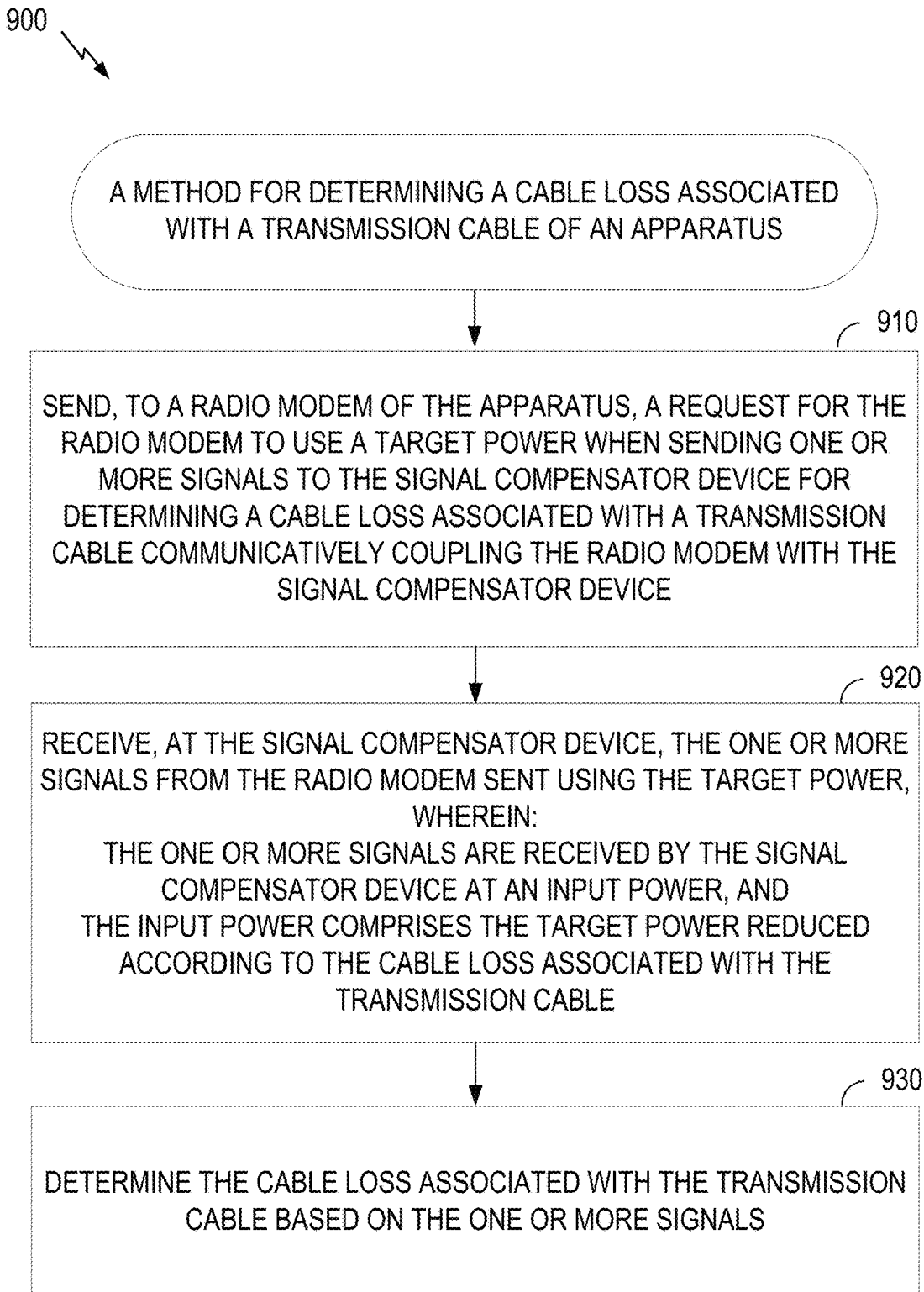
FIG. 9 is a flow diagram illustrating example operations for determining cable loss of a transmission cable.

Wireless communications network 100 includes cable loss measurement component 198, which may be configured to perform the operations illustrated in one or more of FIGS. 8-9, as well as other operations described herein for determining a cable loss associated with the transmission cable of an apparatus. As shown, the cable loss measurement component 198 may be included within a UE 104, such as a vehicle.

Figure 2:
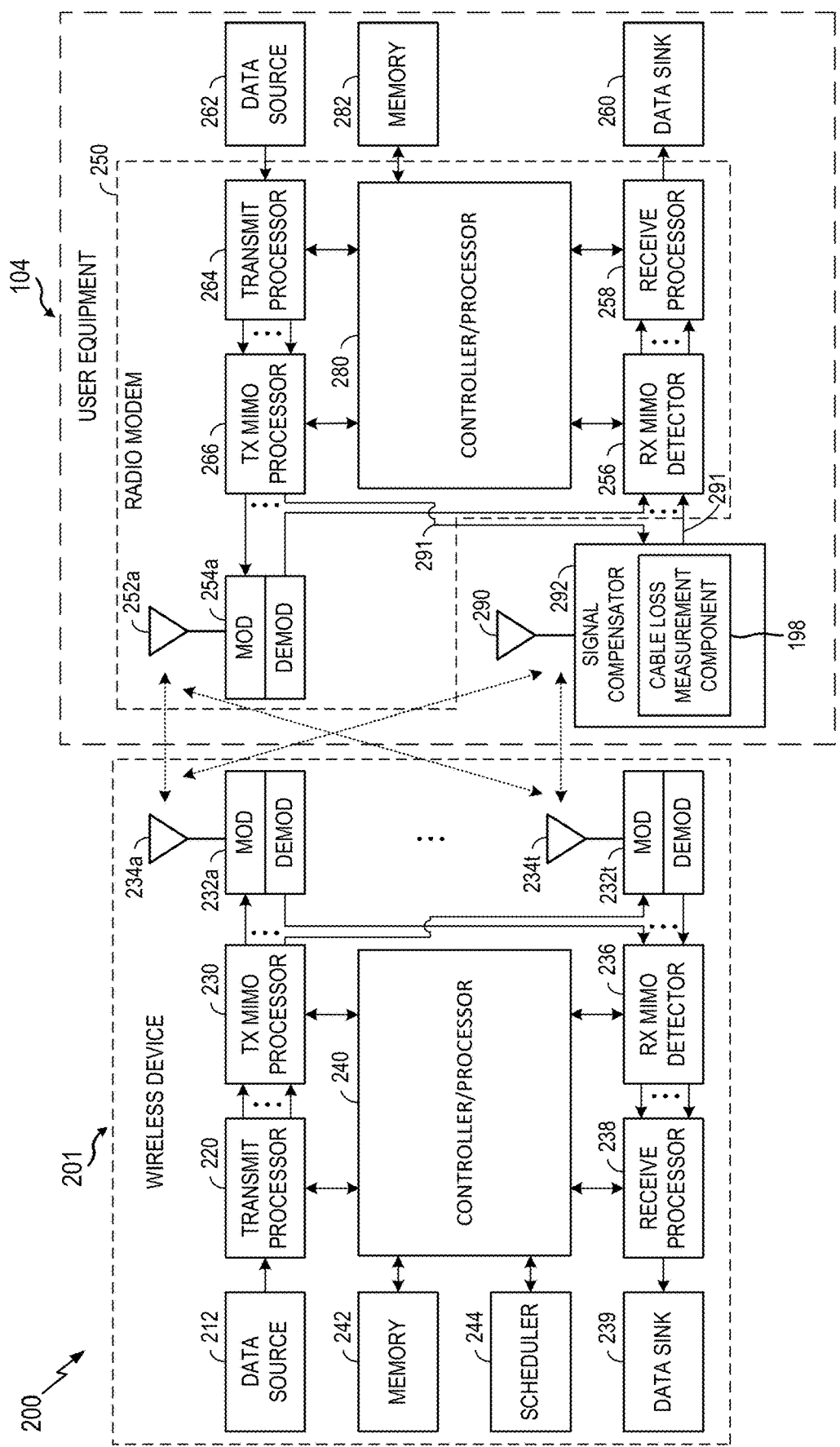
FIG. 2 is a block diagram conceptually illustrating aspects of an example of a base station and user equipment.

FIG. 2 depicts aspects of an example wireless device 201 and a user equipment (UE) 104.

Generally, the wireless device 201 includes various processors (e.g., 220, 230, 238, and 240), antennas 234a-t (collectively 234), transceivers 232a-t (collectively 232), which include modulators and demodulators, and other aspects, which enable wireless transmission of data (e.g., data source 212) and wireless reception of data (e.g., data sink 239). For example, wireless device 201 may send and receive data between itself and UE 104. In some cases, wireless device 201 may be an example of the wireless device 102, such as a BS or RSU. In some cases, wireless device 201 may be an example of the UE 104. In some cases, wireless device 201 may be a vehicle, such as one or more of the vehicles illustrated in FIG. 3, 4, or 5, which incorporate or include the UE 104.

Wireless device 201 includes controller/processor 240, which may be configured to implement various functions related to wireless communications.

As shown, UE 104 includes a radio modem 250, which may handle modulation/demodulation and encoding/decoding of signals for wireless communication via one or more antennas, such as the one or more antennas 252 and/or antenna 290. As shown, the radio modem 250 includes various processors (e.g., 258, 264, 266, and 280), one or more antennas 252, one or more transceivers 254, which include modulators and demodulators, and other aspects, which enable wireless transmission of data (e.g., data source 262) and wireless reception of data (e.g., data sink 260). In some cases, the wireless device 201 and/or UE 104 may be a vehicle, such as one or more of the vehicles illustrated in FIG. 3, 4, or 5.

In some cases, the one or more antennas 252 may be colocated with the radio modem 250 while the antenna 290 is located significantly further away and communicatively coupled with the radio modem 250 via a transmission cable 291. While the transmission cable 291 is illustrated as two separate transmission cables (e.g., communicatively coupling the signal compensator device to the TX MIMO processor 266 and communicatively coupling the signal compensator device to the RX MIMO detector 256), it should be understood that the transmission cable 291 may be a single transmission cable coupling the signal compensator device 292 to the radio modem 250.

When outputting signals for wireless communication via the antenna 290, the radio modem 250 may send the signals at a particular transmission power to a signal compensator device 292 via the transmission cable 291. The signal compensator device 292 may then amplify the received signals to account for attenuation associated with the transmission power due to the transmission cable 291, known as cable loss. Once amplified, the signal compensator device 292 outputs the signals for transmission via the antenna 290. In some cases, the signal compensator device 292 may include the cable loss measurement component 198 and be configured to perform one or more of the operations illustrated in FIGS. 8-9 for determining a cable loss associated with the transmission cable 291. Notably, while depicted as an aspect of signal compensator device 292, cable loss measurement component 198 may be implemented additionally or alternatively in various other aspects of UE 104 in other implementations.

Further discussions regarding FIG. 1 and FIG. 2 are provided later n this disclosure.

Introduction to Sidelink Communication

In some examples, two or more subordinate entities (e.g., UEs 104) may communicate with each other using sidelink signals. Real-world applications of such sidelink communications may include public safety, proximity services, UE-to-network relaying, vehicle-to-vehicle (V2V) communications, vehicle-to-everything (V2X), Internet of Everything (IoE) communications, IoT communications, mission-critical mesh, and/or various other suitable applications. Generally, a sidelink signal may refer to a signal communicated from one subordinate entity (e.g., UE 104) to another subordinate entity (e.g., another UE 104) without relaying that communication through the scheduling entity (e.g., UE 104 or wireless device 102), even though the scheduling entity may be utilized for scheduling and/or control purposes. In some examples, the sidelink signals may be communicated using a licensed spectrum (unlike wireless local area networks, which typically use an unlicensed spectrum). One example of sidelink communication is PC5, for example, as used in V2V, LTE, and/or NR.

Various sidelink channels may be used for sidelink communications, including a physical sidelink discovery channel (PSDCH), a physical sidelink control channel (PSCCH), a physical sidelink shared channel (PSSCH), and a physical sidelink feedback channel (PSFCH). The PSDCH may carry discovery expressions that enable proximal devices to discover each other. The PSCCH may carry control signaling such as sidelink resource configurations, resource reservations, and other parameters used for data transmissions, and the PSSCH may carry the data transmissions. The PSFCH may carry feedback such as acknowledgment (ACK) and or negative ACK (HACK) information corresponding to transmissions on the PSSCH. In some systems (e.g., NR Release 16), a two stage SCI may be supported. Two stage SCI may include a first stage SCI (SCI-1) and a second stage SCI (e.g., SCI-2). SCI-1 may include resource reservation and allocation information, information that can be used to decode SCI-2, etc. SCI-2 may include information that can be used to decode data and to determine whether the UE is an intended recipient of the transmission. SCI-1 and/or SCI-2 may be transmitted over PSCCH.

Figure 3:
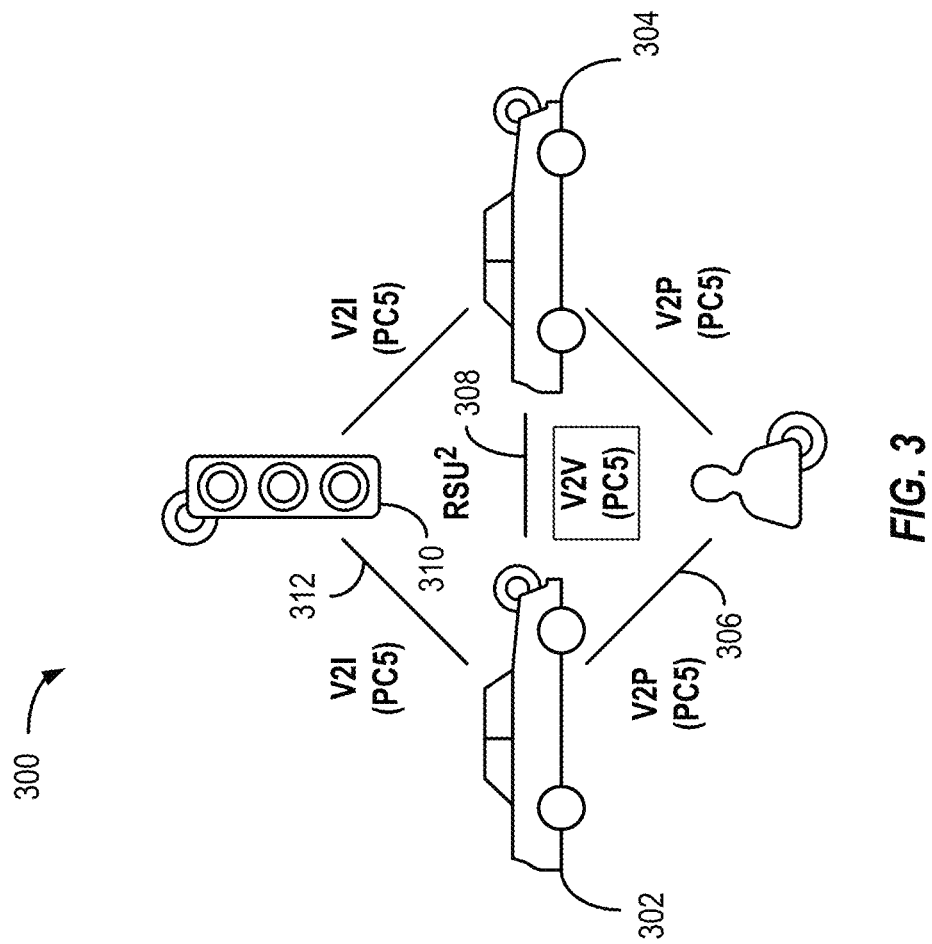
FIGS. 3 and 4 show diagrammatic representations of example vehicle to everything (V2X) systems.
Figure 4:
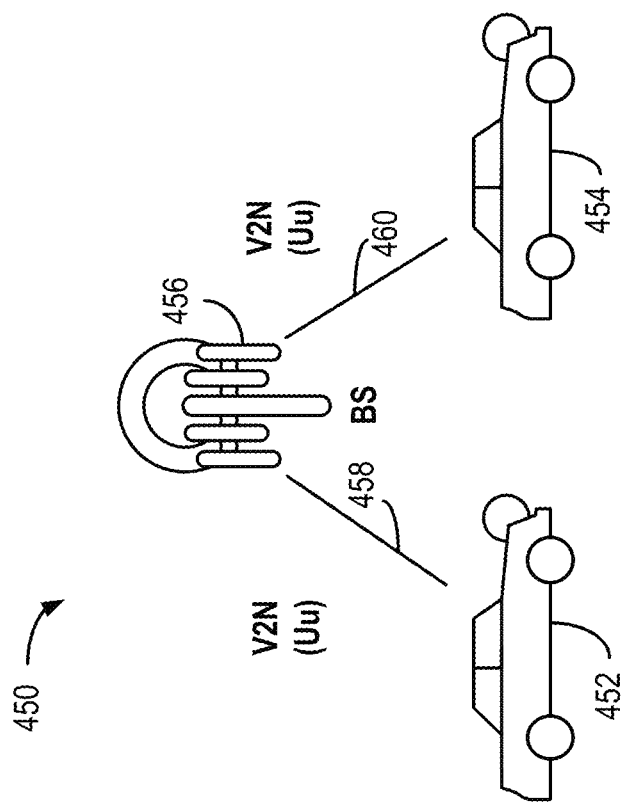

FIG. 3 and FIG. 4 show diagrammatic representations of example V2X systems, in accordance with some aspects of the present disclosure. For example, the vehicles shown in FIG. 3 and FIG. 4 may communicate via sidelink channels and may relay sidelink transmissions as described herein. V2X is a vehicular technology system that enables vehicles to communicate with the traffic and the environment around them using short-range wireless signals, known as sidelink signals.

The V2X systems provided in FIG. 3 and FIG. 4 provide two complementary transmission modes. A first transmission mode (also referred to as mode 4), shown by way of example in FIG. 3, involves direct communications (for example, also referred to as sidelink communications) between participants in proximity to one another in a local area. A second transmission mode (also referred to as mode 3), shown by way of example in FIG. 4, involves network communications through a network, which may be implemented over a Uu interface (for example, a wireless communication interface between a radio access network (RAN) and a UE).

Referring to FIG. 3, a V2X system 300 (for example, including vehicle-to-vehicle (V2V) communications) is illustrated with two vehicles 302, 304. The first transmission mode allows for direct communication between different participants in a given geographic location. As illustrated, a vehicle can have a wireless communication link 306 with an individual (V2P) (for example, via a UE) through a PC5 interface. Communications between the vehicles 302 and 304 may also occur through a PC5 interface 408. In a like manner, communication may occur from a vehicle 302 to other highway components (for example, roadside unit (RSU) 310), such as a traffic signal or sign (V2I) through a PC5 interface 312. With respect to each communication link illustrated in FIG. 3, two-way communication may take place between elements, therefore each element may be a transmitter and a receiver of information. The V2X system 300 may be a self-managed system implemented without assistance from a network entity. A self-managed system may enable improved spectral efficiency, reduced cost, and increased reliability as network service interruptions do not occur during handover operations for moving vehicles. The V2X system may be configured to operate in a licensed or unlicensed spectrum, thus any vehicle with an equipped system may access a common frequency and share information. Such harmonized/common spectrum operations allow for safe and reliable operation.

FIG. 4B shows a V2X system 450 for communication between a vehicle 452 and a vehicle 454 through a network entity 456. These network communications may occur through discrete nodes, such as a BS (e.g., the wireless device 102), that sends and receives information to and from (for example, relays information between) vehicles 452, 454. The network communications through vehicle to network (V2N) links 458 and 460 may be used, for example, for long-range communications between vehicles, such as for communicating the presence of a car accident a distance ahead along a road or highway. Other types of communications may be sent by the wireless node to vehicles, such as traffic flow conditions, road hazard warnings, environmental/weather reports, and service station availability, among other examples. Such data can be obtained from cloud-based sharing services.

RSUs, such as RSU 410, may be utilized. An RSU may be used for V2I communications. In some examples, an RSU may act as a forwarding node to extend coverage for a UE. In some examples, an RSU may be co-located with a BS or may be standalone. RSUs can have different classifications. For example, RSUs can be classified into UE-type RSUs and Micro NodeB-type RSUs. Micro NodeB-type RSUs have similar functionality as a Macro eNB or gNB. The Micro NodeB-type RSUs can utilize the Uu interface. UE-type RSUs can be used for meeting tight quality-of-service (QoS) requirements by minimizing collisions and improving reliability. HE-type RSUs may use centralized resource allocation mechanisms to allow for efficient resource utilization. Critical information (e.g., such as traffic conditions, weather conditions, congestion statistics, sensor data, etc.) can be broadcast to UEs in the coverage area. Relays can re-broadcasts critical information received from some UEs. HE-type RSUs may be a reliable synchronization source.

Figure 5:
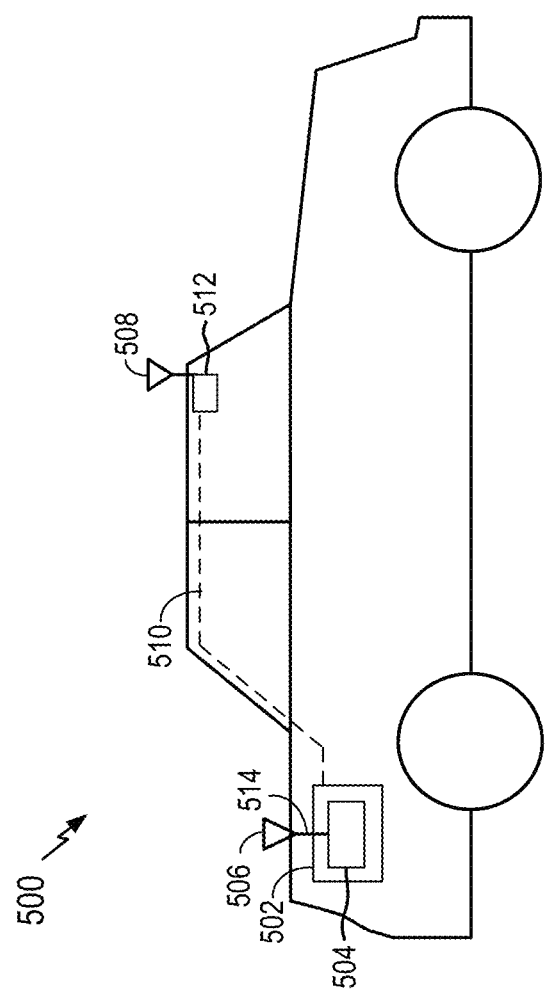
FIG. 5 illustrates placement of multiple antennas on a vehicle.

Aspects Related to Determining a Cable Loss Associated with a Transmission Cable of an Apparatus In certain cases, the V2X-capable vehicles 302, 304, 452, and 454 described above with respect to FIG. 4A-4B may be configured to communicate via multiple antennas. These multiple antennas may be located on different parts of a vehicle. FIG. 5 illustrates placement of multiple antennas on a vehicle 500. The vehicle 500 may be an example of any one of the vehicles 302, 304, 452, or 454 illustrated in FIG. 4. Additionally, in some cases, the vehicle 500 may incorporate or be an example of the UE 104 illustrated in FIGS. 1 and 2.

As shown, the vehicle 500 may include a plurality of antennas, such as a first antenna 506 and a second antenna 508. The first antenna 506 may be located on a rear portion of the vehicle 500 and may be configured to receive signals originating from behind the vehicle 500. Additionally, the second antenna 508 may be located on a front portion of the vehicle 500 and may be configured to receive signals originating from ahead of the vehicle 500. In some cases, the first antenna 506 may be an example of one of the one or more antennas 252 illustrated in FIG. 2 while the second antenna 508 may be an example of the antenna 290 illustrated in FIG. 2.

Further, as shown, the vehicle 500 includes a telematics control unit (TCU) 502. The TCU may be configured to manage many different types of communication, such as code division multiple access (CDMA) communication, third generation (3G) evolution data (EV-DO) communication, fourth generation (4G) long term evolution (LTE) communication, fifth generation (5G) new radio (NR) communication, global positioning system (GPS) communication, wide local area network (WLAN) communication, and the like. Further, as shown, the TCU 502 may include a radio modem 504, which handles modulation/demodulation, encoding/decoding, and power amplification of signals for wireless communication via the first antenna 506 and second antenna 508. In some cases, the radio modem 504 may be an example of the radio modem 250 of the UE 104 illustrated in FIG. 2.

In some cases, due to certain pressures from vehicle manufacturers and regulatory bodies, the TCU 502 may be placed in a crash-resistant location of the vehicle 500. For example, as illustrated in FIG. 5, the TCU 502 may be located within a trunk of the vehicle 500. As a result, the TCU 502 (and radio modem 504) may be located closer to the first antenna 506 as compared to the second antenna 508, leading to the use of a longer transmission cable 510 being used to communicatively couple the second antenna 508 with the radio modem 504 as compared to a transmission cable 514 used to communicatively couple the first antenna 506 with the radio modem 504.

These transmission cables may be associated with a cable loss, representing an amount of attenuation caused to a signal sent via these transmission cables. Signals sent using longer transmission cables (e.g., transmission cable 510) may experience greater attenuation than signals sent via shorter transmission cables (e.g., transmission cable 514). For example, when outputting signals for wireless communication via the second antenna 508, a power amplifier of the radio modem 504 may send these signals at a particular transmission power. However, due to lossy characteristics of the transmission cable 510, the transmission power used by power amplifier of the radio modem 504 to send these signals may be attenuated by the transmission cable 510. This attenuation results in a reduced transmission power seen at the second antenna 508, which can lead to these signals not being received by an intended recipient.

To help account for cable loss (e.g., attenuation) associated with the transmission cable 510, the vehicle 500 also includes a signal compensator device 512. In some cases, the signal compensator device 512 may be an example of the signal compensator device 292 illustrated in FIG. 2. The signal compensator device 512 is configured to receive the signals from the radio modem 504 and amplify the transmission power associated with these signals such that the attenuation/cable loss of the transmission power associated with the transmission cable 510 is canceled out. In other words, the signal compensator device 512 is configured to reproduce the transmission power output by the power amplifier of the radio modem 504 after the signals output by the radio modem 504 have traversed the transmission cable 510. This ensures that the signals may be transmitted via the second antenna 508 using the proper transmission power. It should be noted that only the second antenna 508, and not the first antenna 506, is associated with a signal compensator device. This is because a length of the first antenna 506 is significantly shorter such that cable loss associated with the first antenna 506 is negligible.

The cable loss associated with the transmission cable 510 may be unknown to the signal compensator device 512 as well as the radio modem 504, ranging, in some cases, between 3 decibels (dB) to 15 dB. As such, the signal compensator device 512 may not know how much to amplify the attenuated transmission power of the received signals (e.g., how much gain to apply to transmission power of the received signals) in order to achieve the transmission power output by the power amplifier of the radio modem 504. Accordingly, in order to determine the cable loss associated with the transmission cable 510, the signal compensator device 512 may be configured to perform cable loss measurements associated with the transmission cable 510.

A straight forward way to perform these cable loss measurements would be to use a power sensor to measure the transmission power to the one or more signals at an input of the signal compensator device 512 and compare the measured transmission power to a known transmission power used by the radio modem 504. However, due to certain hardware restrictions of the signal compensator device 512, the power sensor may be located at an output of the signal compensator device 512 after other circuitry in the signal compensator device 512, such as a radio frequency (RF) attenuator, a power amplifier, one or more electrical switches, filters, and the like. As a result, in order to accurately measure an input power associated with the one or more signals received from the radio modem 504 using a power sensor located near an output of the signal compensator device 512, power losses and gains associated with the other circuitry of the signal compensator device 512 may be taken into account. In other words, these power losses and gains associated with the other circuitry of the signal compensator device 512 may be removed from an output power measured by the power sensor at the output of the signal compensator device 512. This process is described in more detail with respect to FIG. 6.

Figure 6:
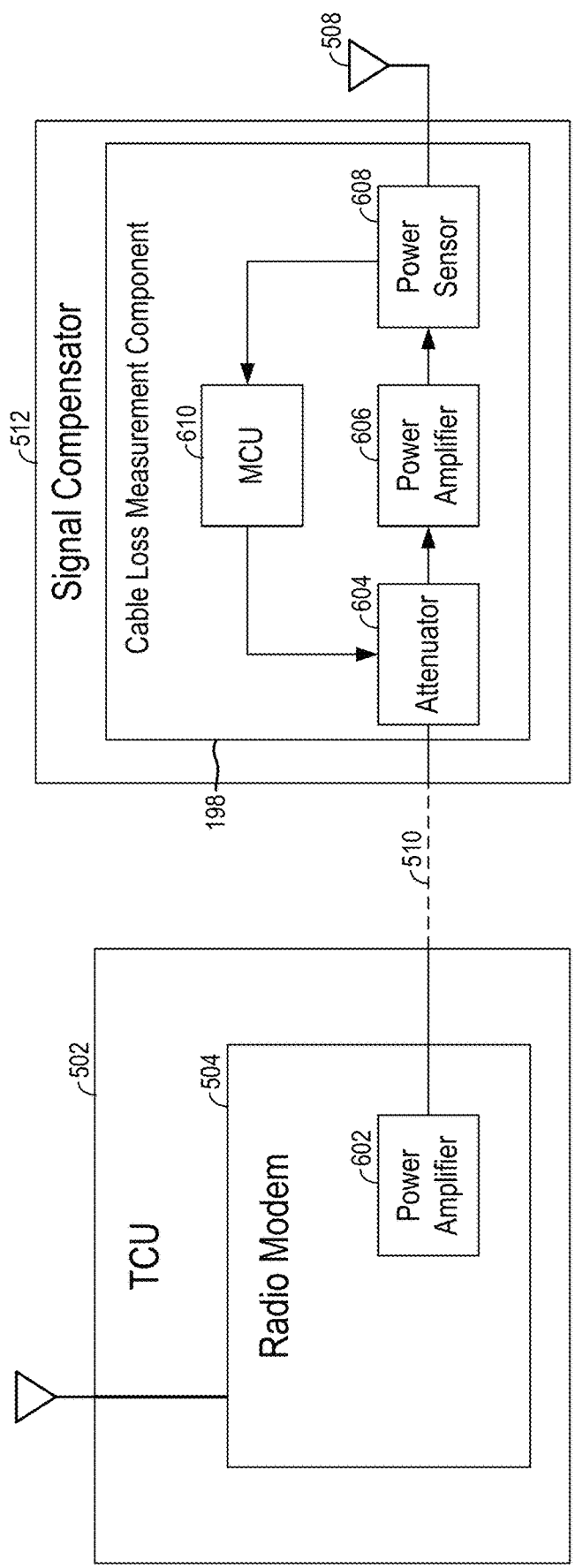
FIG. 6 is a block diagram illustrating electrical components of the radio modem and signal compensator device.

FIG. 6 is a block diagram illustrating electrical components of the radio modem 504 and signal compensator device 512. In some cases, the signal compensator device 512 may be an example of the signal compensator device 292 illustrated in FIG. 2 and may include the cable loss measurement component 198 configured to determine a cable loss associated with a transmission cable.

As shown in FIG. 6, the radio modem 504 of the TCU 502 includes a power amplifier 602, which is configured to send one or more signals at a particular transmission power to the signal compensator device 512 via the transmission cable 510. These one or more signals may be received by the cable loss measurement component 198 of the signal compensator device 512 at an input power. The one or more signals may then pass through a variable attenuator 604 and power amplifier 606 of the cable loss measurement component 198. The power amplifier 606 is configured to amplify the input power according to a fixed gain value while the variable attenuator 604 may be configured to adjust this fixed gain value in order to be able to adjust the gain of the input power of the one or more signals. In other words, the variable attenuator may be used to set a particular gain value associated with the input power of the received one or more signals.

In some cases, the gain to be applied to the one or more signals received from the radio modem 504 may be set by a microcontroller unit (MCU) 610 (e.g., a processor) of the cable loss measurement component 198 of the signal compensator device 512. For example, in order to set the gain of the input power, the MCU 610 may provide signaling to the variable attenuator 604, instructing the variable attenuator 604 to attenuate the input power by a certain amount such that, when the input power is amplified by the fixed gain of the power amplifier 606, a target gain for the input power of the one or more signals is achieved. Thereafter, a power sensor 608 of the cable loss measurement component 198 of the signal compensator device 512 may be used to measure an output power of the one or more signals (e.g., the amplified input power of the one or more signals). In some cases, power measurements from the power sensor 608 may be used by the MCU 610 to adjust the target gain for the one or more signal.

To perform the cable loss measurements associated with the transmission cable 510, the power amplifier 602 of the radio modem may be configured to send the one or more signals at a known transmission power (e.g., a transmission power that is known to, or expected by, the signal compensator device 512) via the transmission cable 510. As noted above, the one or more signals transmitted by the radio modem 504 according to the known transmission power may be received by the signal compensator device 512 at an input power (e.g., equating to the transmission power used by the power amplifier 602 minus an amount of power lost due to cable loss of the transmission cable 510).

During cable loss measurement, the MCU 610 of the cable loss measurement component 198 may be configured to set the signal compensator device 512 to amplify input power of the one or more signals according to a pre-defined target gain value used for cable loss measurement. In other words, the MCU 610 may set the variable attenuator to attenuate the input power of the one or more signals such that, when amplified by the power amplifier 606, the pre-defined target gain value is achieved.

Accordingly, once the one or more signals are received from the radio modem 504, the one or more signals may be amplified by the signal compensator device (e.g., variable attenuator 604 and power amplifier 606) according to the preconfigured gain value. Thereafter, the power sensor 608 may measure an output power of the one or more signals after being amplified according to the preconfigured gain value.

To determine the cable loss of the transmission cable 510, the MCU 610 of the cable loss measurement component 198 may then remove any power gains or losses (e.g., due to the variable attenuator 604, power amplifier 606, and other components of the signal compensator device 512, such as filters, resisters, electrical switches, etc.) from the measured output power of the one or more signals, resulting in the input power of the one or more signals seen at an input of the signal compensator device 512. Thereafter, the MCU 610 may determine a difference between the transmission power of the one or more signal (e.g., the transmission power used by the power amplifier 602 of the radio modem 504 to send the one or more signals) and the input power of the one or more signals determined by the MCU 610 (e.g., after removing the power gains and losses from the measured output power of the one or more signals). The difference between the transmission power of the one or more signals from the radio modem 504 and the input power of the one or more signals at the signal compensator device 512 represents the cable loss of the transmission cable 510.

In some cases, the output power of the one or more signals from at least the second antenna 508 of the vehicle 500 illustrated in FIG. 5 may be constrained by certain regulatory bodies and in certain geographical areas. As a result, the radio modem 504 of the vehicle 500 may, in some cases, be required to apply a technique known as additional maximum power reduction (A-MPR) to reduce or cap the output power of the one or more signals transmitted by the second antenna 508 depending on certain criteria, such as an RF channel over which the one or more signals will be transmitted, a total number of resource blocks (RBs) that will be occupied by the one or more signals, a starting RB associated with the one or more signals, and a peak antenna gain associated with the second antenna 508.

Figure 7:
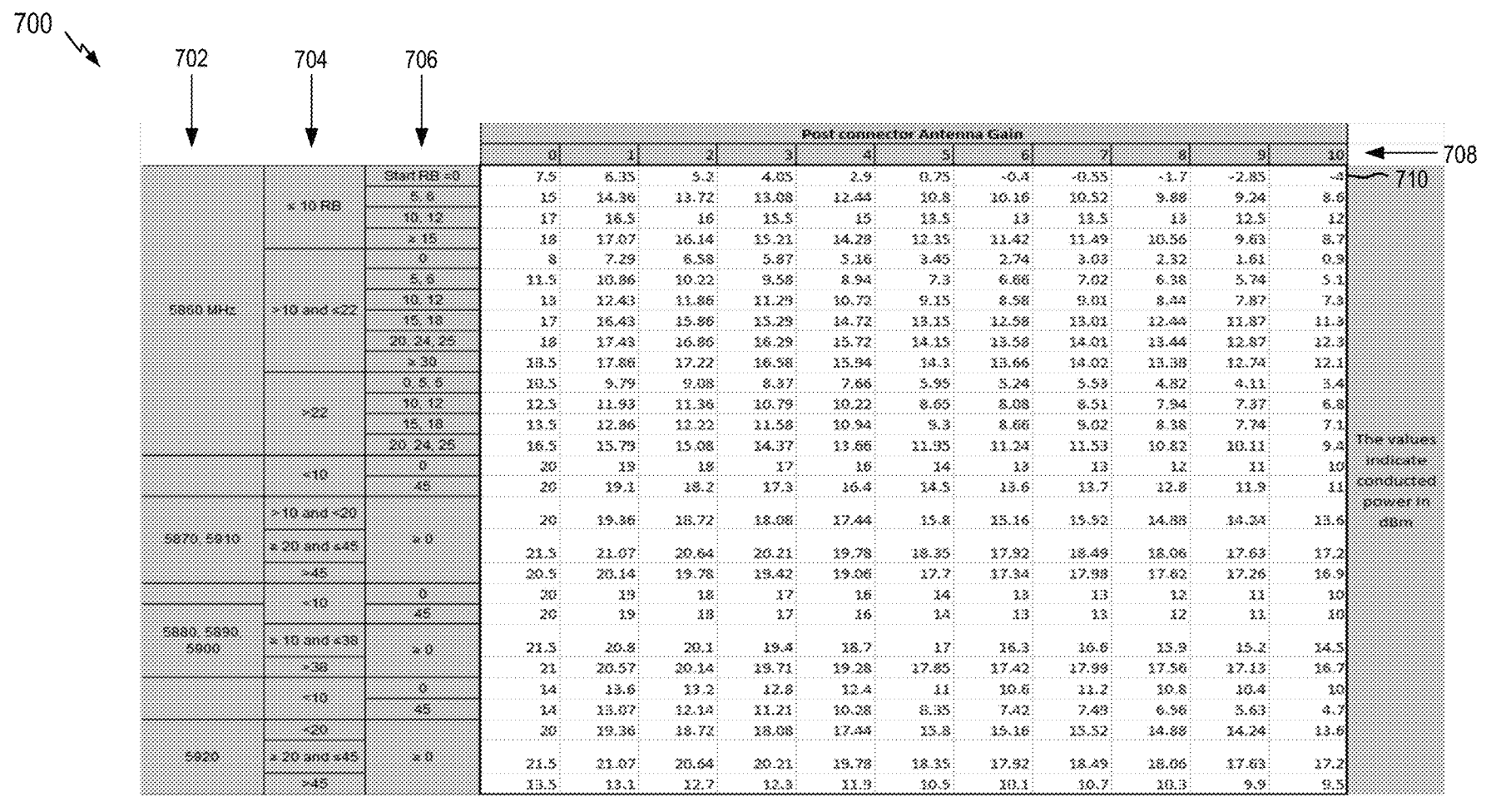

In some cases, the radio modem 504 of the TCU 502 may determine the (reduced/capped) output power based on an A-MPR table, such as the A-MPR table 700 illustrated in FIG. 7. In some cases, the A-MPR table 700 may be associated with a particular geographical region, such as Europe, and used by the radio modem 504 to determine the (reduced/capped) output power when the vehicle 500 is located in this geographical region.

As shown, the A-MPR table 700 specifies different output powers (in dBm) for transmitting signals via one or more antennas, such as the second antenna 508. These different output powers may depend on various criteria as noted above, such as the RF channel over which the one or more signals will be transmitted (e.g., illustrated at 702 in FIG. 7), the total number of RBs that will be occupied by the one or more signals (e.g., illustrated at 704 in FIG. 7), the starting RB associated with the one or more signals (e.g., illustrated at 706 in FIG. 7), and the peak antenna gain associated with the second antenna 508 (e.g., illustrated at 708 in FIG. 7). As an example, assume the peak antenna gain of the second antenna 508 is 10 dBi (e.g., antenna gain in dB above an isotropic radiator), the RF channel over which the one or more signals will be transmitted is the 5860 MHz channel, the total number of RBs over which the one or more signals will be transmitted in less than 10, and the starting RB is RB #0. Further, assume that the requested transmission or output power for transmitting the one or more signals is 20 dBm. In this scenario, the radio modem 504 is capped at −4 dBm, as shown at 710, even though the requested output/transmission power for the one or more signals is 20 dBm.

In some cases, the radio modem 504 may be expected to apply the power requirements/constraints imposed by the A-MPR table 700 individually to each signal (e.g., packet) output for transmission by the radio modem 504, even during cable loss measurement. In other words, each time a signal is output for transmission by the radio modem 504, the radio modem 504 determines a corresponding output/transmission power for this particular signal. As a result, the output/transmission powers may vary greatly between different signals (e.g., packets), which can cause issues when trying to perform cable loss measurements associated with the transmission cable 510.

For example, as noted above, during cable loss measurement, the radio modem 504 is required to output signals according to a transmission power known to the signal compensator device 512. However, because the radio modem 504 in certain geographical regions is required to apply the A-MPR table 700 when determining the output/transmission power for signals output by the radio modem 504 for transmission, signals used for cable loss measurement, which would typically be output by the radio modem 504 for transmission according to a known transmission power, may instead be output for transmission by the radio modem 504 at varying output/transmission powers. These varying output/transmission powers can cause issues with cable loss measurement because the signal compensator device 512 may not be aware of the actual output/transmission used by the radio modem 504 for any given signal (e.g., packet).

As a result, while the MCU 610 may still be able to determine an accurate input power of the signals at an input of the signal compensator device 512 (e.g., based on power measurements by the power sensor 608 at an output of the signal compensator device 512), the MCU 610 may not be able to determine the difference between the input power of the signals and the output/transmission power used by the radio modem 504. In other words, the MCU 610 may not be able to determine the cable loss associated with the transmission cable 510 since the output/transmission power used by the radio modem 504 is unknown to the MCU 610.

In some cases, this lack of knowledge regarding the cable loss associated with the transmission cable 510 may cause the signal compensator device 512 to apply a gain to signals received from the radio modem 504 that is less than a gain required to compensate for the cable loss associated with the transmission cable 510. As a result, these signals are output for transmission by the signal compensator device 512 at a transmission power that is less than a transmission power intended by the radio modem 504, causing these signals, in some cases, to not be received by intended recipients.

Accordingly, aspects of the present disclosure provide techniques for accurately performing cable loss measurement in apparatuses (e.g., vehicles) that are subject to certain power constraints (e.g., A-MPR requirements) in certain geographical regions. In some cases, such techniques may involve requesting a radio modern of the apparatus to use a particular target power (e.g., target transmission power), when sending one or more signals to a signal compensator device of the apparatus, that is less than or equal to a lowest transmission power specified by an A-MPR requirement associated with the geographical region.

Additionally, in some cases, the techniques presented herein may also involve iteratively increasing a target gain value of the signal compensator device to be applied to the one or more signals received from the modem until the output power of the signal compensator device is greater than or equal to a minimum output power for determining the cable loss. Iteratively increasing the target gain value of the signal compensator device may ensure that emission constraints of the geographical require are not violated while determining the target gain value that results in an output power of the signal compensator device that is large enough to provide accurate power measurements to determine the cable loss. Additionally, by accurately determining the cable loss, it can be ensured that the one or more signals are transmitted at a proper transmission power so that they may be received by one or more intended recipients. Moreover, by transmitting the one or more signals at the proper transmission power, a number of retransmissions of the one or more signals in order to be received by the one or more intended recipients may be reduced, which conserves power resources at the apparatus as well as time and frequency resources within the wireless network in which the one or more signals are transmitted.

Example Call Flow Illustrating Operations for Determining a Cable Loss Associated with a Transmission Cable of an Apparatus FIG. 8 is a call flow diagram illustrating example operations 800 performed by the radio modem 504 and the signal compensator device 512 of the vehicle 500 for determining a cable loss associated with the transmission cable 510 communicatively coupling the radio modem 504 with signal compensator device 512.

Operations 800 begin at 810 with the signal compensator device 512 sending, to the radio modem 504, a request for the radio modem 504 to use a target power when sending one or more signals to the signal compensator device 512 for determining a cable loss associated with the transmission cable 510. In some cases, when the vehicle 500 is operating in a particular geographical region, the vehicle 500 may be subject to certain power constraints when transmitting signals. These power constraints may include the A-MPR requirements above, which require the radio modern 504 of the vehicle 500 to reduce or cap the target transmission power of the one or more signals transmitted by the second antenna 508 depending on certain criteria, such as an RF channel over which the one or more signals will be transmitted, a total number RBs that will be occupied by the one or more signals, a starting RB associated with the one or more signals, and a peak antenna gain associated with the second antenna 508. In some cases, these A-MPR requirements may be related to V2X communications by the vehicle 500.

In some cases, the target power requested by the signal compensator device 512 may be less than or equal to a lowest transmission power specified by the A-MPR requirements associated with the particular geographical region, such as Europe or any other geographical region that imposes these requirements. In some cases, the requested target power may be selected to be less than or equal to the lowest transmission power within the A-MPR table 700 depending on the peak antenna gain of the second antenna 508. For example, assuming the peak antenna gain associated with the second antenna 508 is 8 dBi, the target power may comprise a target power of −1.7 or −2 dBm, for example. In other cases, assuming a peak antenna gain of 10 dBi, the target power may comprise a target power of −4 or −5 dBm.

By requesting a target power that is less than or equal to a lowest transmission power specified by the A-MPR requirement, the signal compensator device 512 can ensure that the radio modem 504 outputs the one or more signals a transmission power that remains constant. In other words, when signals are transmitted using the requested target power, the A-MPR requirements will not be invoked and the radio modem 504 will not vary or cap the power used to send the one or more signals to the signal compensator device 512. As a result, the signal compensator device 512 can expect the one or more signals to be received at a generally fixed input power.

Thereafter, as shown at 815 in FIG. 8, the signal compensator device 512 receives the one or more signals from the radio modem 504 sent using the target power. In some cases, the target power may be applied to the one or more signals by the power amplifier 602 of the radio modem 504 prior to the one or more signals being sent to the signal compensator device 512. The one or more signals may be received by the signal compensator device 512 at an (fixed) input power at an input of the signal compensator device 512. While not measured at the input of the signal compensator device 512, the input power that is input to the signal compensator device 512 comprises the target power reduced according to the cable loss associated with the transmission cable 510.

Thereafter, in blocks 820-830, the signal compensator device 512 iteratively determines and applies increasing target gain values to the input power of the signal compensator device 512 until a resulting output power of the signal compensator device 512 is greater than or equal to a minimum reliable output power required for accurately determining the cable loss. The purpose of performing this iterative process of determining and applying target gain values is to ensure that the vehicle does not violate emission regulations when transmitting the one or more signals used since the cable loss is unknown.

For example, there may be cases in which the cable loss associated with the transmission cable is low (e.g., 3 dB). In this case, if the signal compensator device were to apply a high target gain value, this high target gain value (in addition to a gain associated with the second antenna 508) could result in the one or more signals transmitted via the second antenna 508 having a transmission power of above a maximum transmission power (e.g., −4 dBm), leading to emission violations. Therefore, the signal compensator device 512 may start with a more conservative target gain value, ensuring the output power does not exceed the maximum transmission power, and iteratively increase the target gain value until the output power of the signal compensator device 512 is greater than or equal to the minimum reliable output power required for accurately determining the cable loss. After each iteration, if the output power of the signal compensator device 512 is not greater than or equal to a minimum reliable output power, it can be assumed that the cable loss of the transmission cable 510 is greater, allowing the signal compensator device 512 to safely increase the target gain value (e.g., subject to a respective maximum value for each iteration) without the potential for the one or more signals transmitted via the second antenna 508 violating emissions regulations.

Accordingly, in block 820, for a first iteration, the signal compensator device 512 may determine a first target gain value for amplifying the input power of the signal compensator device 512. In some cases, the first target gain value may be determined by the MCU 610. For example, the MCU 610 may set the variable attenuator 604 such that the target gain value is achieved, for example, as described above. In some cases, the first target gain value may be subject to a first maximum value so that the one or more signals transmitted via the second antenna 508 do not violate emissions regulations (e.g., if, by chance, the cable loss is relatively low), as described above. In other words, the first target gain value may not be greater than the first maximum value.

Thereafter, also in block 820, the signal compensator device 512 amplifies the input power of the signal compensator device (e.g., associated with the one or more signals received from the radio modem 504) according to the first target gain value to generate a first output power of the signal compensator device 512. In some cases, the input power may be amplified according to the first target gain value via the variable attenuator 604 and the power amplifier 606 of the signal compensator device.

Thereafter, in decision block 830, the signal compensator device 512 may then measure the first output power resulting from the amplified input power and determine whether the first output power of the signal compensator device is greater than or equal to a minimum reliable output power required for accurately determining the cable loss associated with the transmission cable 510. In some cases, the first output power may be measured by the power sensor 608 of the signal compensator device 512.

In some cases, when in block 830 it is determined that the first output power of the signal compensator device is greater than or equal to the minimum reliable output power, operations 800 proceed to block 835 where the signal compensator device (e.g., the MCU 610) determines the input power of the signal compensator device based on the first output power of the signal compensator device. For example, in some cases, the MCU 610 may receive an indication of the first output power from the power sensor 608. Thereafter, the MCU 610 may remove from the first output power any power gains or losses caused by other electrical components of the signal compensator device 512. In some cases, these other electrical components may include, for example, the variable attenuator 604, the power amplifier 606, and other electrical components, such as filters, switches, resistors, and the like. By removing the power gains and losses caused by these other electrical components of the signal compensator device 512, the MCU 610 is able to determine the input power received by the signal compensator device 512. As noted above, the input power determined by the MCU 610 may comprise the target power reduced according to the cable loss associated with the transmission cable 510.

Thereafter, once the input power of the signal compensator device 512 has been determined (e.g., by removing the power gains and losses from the first output power), the signal compensator device (e.g., the MCU 610) may determine the cable loss of the transmission cable 510 in block 840 of FIG. 8 by determining a difference between the determined input power of the signal compensator device 512 and the target power used by the radio modem 504 to transmit the one or more signals. In other words, because the signal compensator device 512 knows the target power at which the one or more signals are sent by the radio modem 504 and the input power of the one or more signals at the signal compensator device 512, the signal compensator device 512 is able to determine the cable loss of the transmission cable 510 simply by determining the difference between the target power and the input power. That is, the cable loss of the transmission cable is the difference between the target power and the input power in terms of decibels.

In some cases, determining the cable loss in block 840 may additionally or alternatively be performed by the radio modem 504 or one or more other components of the TCU 502. For example, in such cases, after determining the input power received by the signal compensator device 512, the signal compensator device 512 may transmit information to the TCU 502 indicating the input power received by the signal compensator device 512. Thereafter, the radio modem 504 and/or the one or more other components of the TCU 502 may use the information indicating the input power to determine the difference between the determined input power of the signal compensator device 512 and the target power used by the radio modem 504 to transmit the one or more signals. As noted above, this difference represents the cable loss associated with the transmission cable 510. Thereafter, the radio modem 504 may send additional information to the signal compensator device, indicating the cable loss of the transmission cable 510.

Thereafter, once the cable loss of the transmission cable 510 has been determined, the signal compensator device 512 may account for the cable loss when amplifying the one or more signals for transmission via the second antenna 508 so that the one or more signals are transmitted a transmission power intended by the radio modem 504.

Returning now to the decision block 830 illustrated in FIG. 8, if in decision block 830 it is determined that the first output power of the signal compensator device is not greater than or equal to the minimum reliable output power, operations 800 return to block 820. After returning to block 820 (e.g., representing a second iteration of the iterative process described above), the signal compensator device 512 determines determining a second target gain value. In some cases, the second target gain value is subject to a second maximum gain value, which is greater than the first maximum gain value. For example, as noted above, because the first output power of the signal compensator device 512 was not greater than the minimum reliable output power, it may be assumed that the cable loss of the transmission cable 510 is higher and, thus, the second target gain value may be set higher than the first target gain value while still avoiding emissions violations. In some cases, the second target gain value may be determined according to: (first target gain value−first output power)+target power.

Once the second target gain value has been determined, the signal compensator device 512 may then amplify the input power of the signal compensator device 512 according to the determined second target gain value to generate a second output power of the signal compensator device 512. The signal compensator device 512 may measure the second output power in block 825.

Thereafter, when it is determined in block 820 that second output power of the signal compensator device is greater than or equal to the minimum reliable output power, operations again proceed to block 835 with the signal compensator device 512 determining the input power of the signal compensator device based on the second output power of the signal compensator device. The signal compensator device 512 may determine the input power based on the second output power in a similar manner described above with respect to the first output power. Thereafter, in block 840, the signal compensator device 512 determines a difference between the determined input power of the signal compensator device and the target power and determines the cable loss of the transmission cable 510 based on the determined difference, as described above.

However, if in block 830, it is determined that the second output power of the signal compensator device is not greater than or equal to the minimum reliable output power, then operations 800 again return to block 820 where the signal compensator device 512 again increases the target gain value, for example, increasing the second target gain value to a third target gain, which is subject to a third maximum value. The signal compensator device 512 may continue to iteratively increase the target gain value until the output power of the signal compensator device 512 is determined to be greater than or equal to minimum reliable output power or until a maximum number of iterations have been performed. Once the signal compensator device 512 determines that the output power is greater than or equal to the minimum reliable output power, the signal compensator device may proceed with the operations in blocks 835 and 840 to determine the cable loss of the transmission cable 510, as described above.

Example Methods for Determining a Cable Loss Associated with a Transmission Cable FIG. 9 is a flow diagram illustrating example operations 900 for determining cable loss performed by a signal compensator device (e.g., signal compensator device 512) of an apparatus, in accordance with certain aspects of the present disclosure. In some cases, the apparatus may include a vehicle, such any of the vehicles 302, 304, 452, 454, or 500. In some cases, the apparatus may include a UE (e.g., such as the UE 104 in the wireless communication network 100 of FIG. 1) included within a vehicle. The operations 900 may be implemented as software components that are executed and run on one or more processors (e.g., cable loss measurement component 198 of FIG. 2 and/or MCU 610 illustrated in FIG. 6). Further, the transmission and reception of signals by the apparatus in operations 900 may be enabled, for example, by one or more antennas (e.g., antennas 252 and/or 290 of FIG. 2). In certain aspects, the transmission and/or reception of signals by the apparatus may be implemented via a bus interface of one or more processors (e.g., controller/processor 280, including the cable loss measurement component 281, and/or MCU 610) obtaining and/or outputting signals.

The operations 900 begin, in block 910, with the signal compensator device sending, to a radio modem of the apparatus, a request for the radio modem to use a target power when sending one or more signals to the signal compensator device for determining a cable loss associated with a transmission cable communicatively coupling the radio modem with the signal compensator device.

In block 920, the signal compensator device receives the one or more signals from the radio modem sent using the target power. In some cases, the one or more signals are received by the signal compensator device at an input power. Additionally, in some cases, the input power comprises the target power reduced according to the cable loss associated with the transmission cable.

In block 930, the signal compensator device determines the cable loss associated with the transmission cable based on the one or more signals.

In some cases, the target power requested in block 910 is less than or equal to a lowest transmission power specified by an additional maximum power reduction (A-MPR) requirement associated with a particular geographical region. In some cases, the particular geographic region comprises Europe. In some cases, the A-MPR requirement is related to vehicle-to-everything (V2X) communications. In some cases, the target power that is less than or equal to a lowest transmission power specified by the A-MPR requirement depends on a peak antenna gain of an antenna of the signal compensator device.

In some cases, operations 900 further include determining a first target gain value for amplifying the input power of the signal compensator device, wherein the first target gain value is subject to a first maximum gain value. Further, in some cases, operations 900 further include amplifying the input power of the signal compensator device according to the determined first target gain value to generate a first output power of the signal compensator device.

In some cases, operations 900 further include determining whether the first output power of the signal compensator device is greater than or equal to a minimum reliable output power required for accurately determining the cable loss. In some cases, operations 900 further include, when the first output power of the signal compensator device is greater than or equal to the minimum reliable output power determining the input power of the signal compensator device based on the first output power of the signal compensator device and determining a difference between the determined input power of the signal compensator device and the target power. In some cases, determining the cable loss associated with the transmission cable is based on the difference between the determined input power of the signal compensator device and the target power.

In some cases, operations 900 further include, when the first output power of the signal compensator device is not greater than or equal to the minimum reliable output power determining a second target gain value, the second target gain value is subject to a second maximum gain value greater than the first maximum gain value. Additionally, in some cases, operations 900 further include amplifying the input power of the signal compensator device according to the determined second target gain value to generate a second output power of the signal compensator device. In some cases, the second target gain value is determined according to: (first target gain value−first output power)+target power.

In some cases, operations 900 further include, when second output power of the signal compensator device is greater than or equal to the minimum reliable output power: determining the input power of the signal compensator device based on the second output power of the signal compensator device determining a difference between the determined input power of the signal compensator device and the target power. In this cases, determining the cable loss associated with the transmission cable is based on the difference between the determined input power of the signal compensator device and the target power.

In some cases, operations 900 further include, when second output power of the signal compensator device is not greater than or equal to the minimum reliable output power, iteratively increasing the second target gain value until second output power of the signal compensator device is greater than or equal to the minimum reliable output power.

Example Wireless Communication Devices

Figure 10:
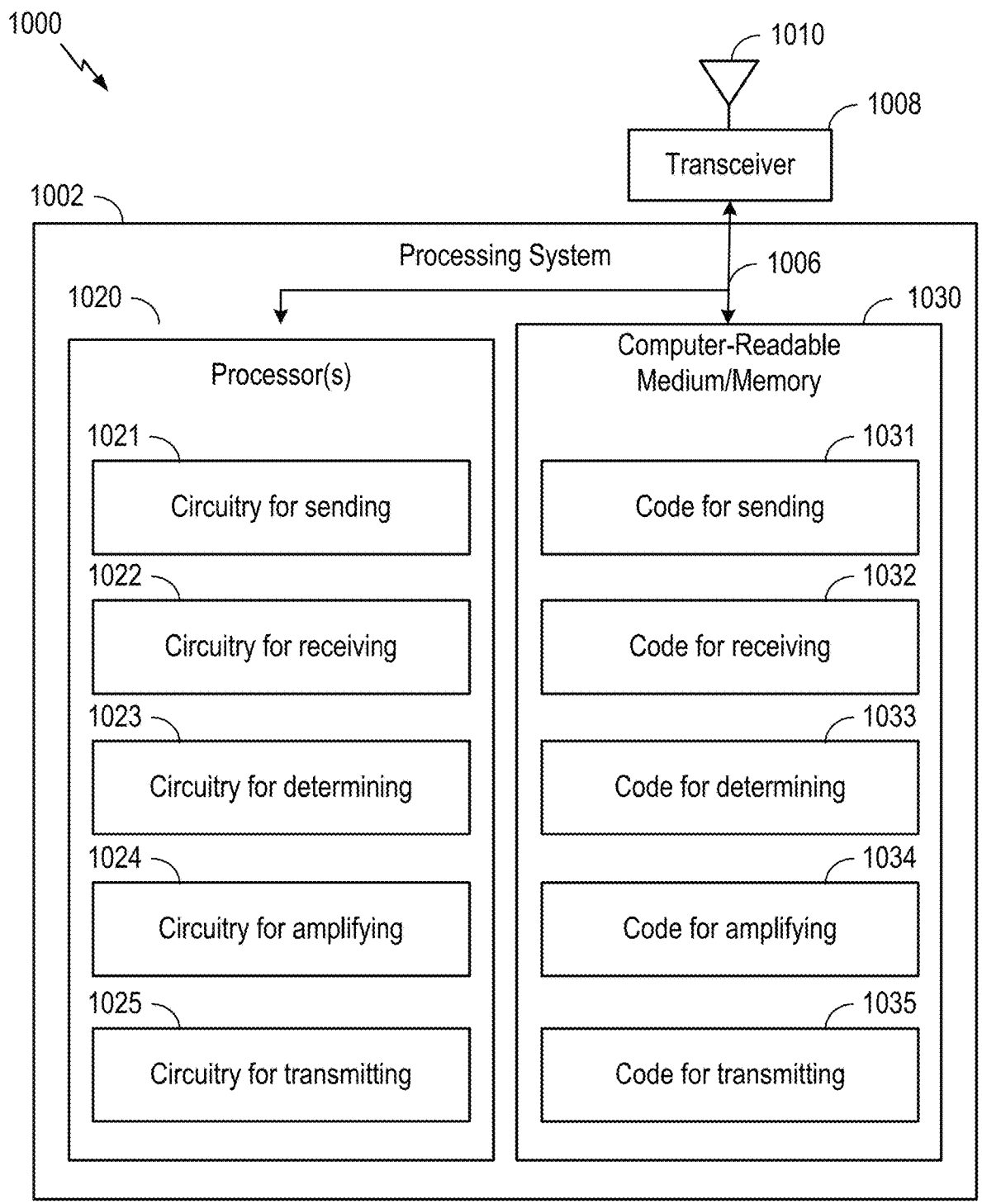
FIG. 10 depicts aspects of an example communications device.

FIG. 10 depicts an example communications device 1000 that includes various components operable, configured, or adapted to perform operations for the techniques disclosed herein, such as the operations depicted and described with respect to FIGS. 8-9. In some examples, communication device 1000 may be a user equipment, such as the UE 104 as described, for example with respect to FIGS. 1 and 2.

Communications device 1000 includes a processing system 1002 coupled to a transceiver 1008 (e.g., a transmitter and/or a receiver). Transceiver 1008 is configured to transmit (or send) and receive signals for the communications device 1000 via an antenna 1010, such as the various signals as described herein. Processing system 1002 may be configured to perform processing functions for communications device 1000, including processing signals received and/or to be transmitted by communications device 1000.

Processing system 1002 includes one or more processors 1020 coupled to a computer-readable medium/memory 1030 via a bus 1006. In certain aspects, computer-readable medium/memory 1030 is configured to store instructions (e.g., computer-executable code) that when executed by the one or more processors 1020, cause the one or more processors 1020 to perform the operations illustrated in FIGS. 8-9, or other operations for performing the various techniques discussed herein for determining a cable loss associated with a transmission cable of an apparatus.

In the depicted example, computer-readable medium/memory 1030 stores code 1031 for sending, code 1032 for receiving, code 1033 for determining, and code 1034 for amplifying, and code 1035 for transmitting.

In the depicted example, the one or more processors 1020 include circuitry configured to implement the code stored in the computer-readable medium/memory 1030, including circuitry 1021 for sending, circuitry 1022 for receiving, circuitry 1023 for determining, circuitry 1024 for amplifying, and circuitry 1025 for transmitting.

Various components of communications device 1000 may provide means for performing the methods described herein, including with respect to FIGS. 8-9.

In some examples, means for transmitting or sending (or means for outputting for transmission) may include the transceivers 254 and/or antenna(s) 252, 290 of the UE 104 illustrated in FIG. 2 and/or transceiver 1008 and antenna 1010 of the communication device 1000 in FIG. 10.

In some examples, means for receiving (or means for obtaining) may include the transceivers 254 and/or antenna(s) 252, 290 of the HE 104 illustrated in FIG. 2 and/or transceiver 1008 and antenna 1010 of the communication device 1000 in FIG. 10.

In some examples, means for determining may include various processing system components, such as: the one or more processors 1020 in FIG. 10, or aspects of the UE 104 depicted in FIG. 2, including receive processor 258, transmit processor 264, TX MIMO processor 266, controller/processor 280, and/or MCU 610 of the cable loss measurement component 198. Additionally, in some cases, means for amplifying may include one or more power amplifiers, such as the power amplifier 602 or the power amplifier 606.

Notably, FIG. 10 is an example, and many other examples and configurations of communication device 1000 are possible.

Example Clauses

Implementation examples are described in the following numbered clauses:

Clause 1: A method for determining cable loss performed by a signal compensator device of an apparatus, comprising: sending, to a radio modem of the apparatus, a request for the radio modem to use a target power when sending one or more signals to the signal compensator device for determining a cable loss associated with a transmission cable communicatively coupling the radio modem with the signal compensator device; receiving, at the signal compensator device, the one or more signals from the radio modem sent using the target power, wherein: the one or more signals are received by the signal compensator device at an input power, and the input power comprises the target power reduced according to the cable loss associated with the transmission cable; and determining the cable loss associated with the transmission cable based on the one or more signals.

Clause 2: The method of Clause 1, wherein the target power is less than or equal to a lowest transmission power specified by an additional maximum power reduction (A-MPR) requirement associated with a particular geographical region.

Clause 3: The method of Clause 2, wherein the particular geographic region comprises Europe.

Clause 4: The method of any of Clauses 2-3, wherein the A-MPR requirement is related to vehicle-to-everything (V2X) communications.

Clause 5: The method of any of Clauses 2-4, wherein the target power that is less than or equal to a lowest transmission power specified by the A-MPR requirement depends on a peak antenna gain of an antenna of the signal compensator device.

Clause 6: The method of any of Clauses 1-5, further comprising determining a first target gain value for amplifying the input power of the signal compensator device, wherein the first target gain value is subject to a first maximum gain value.

Clause 7: The method of Clause 6, further comprising amplifying the input power of the signal compensator device according to the determined first target gain value to generate a first output power of the signal compensator device.

Clause 8: The method of Clause 7, further comprising determining whether the first output power of the signal compensator device is greater than or equal to a minimum reliable output power required for accurately determining the cable loss.

Clause 9: The method of Clause 8, further comprising, when the first output power of the signal compensator device is greater than or equal to the minimum reliable output power: determining the input power of the signal compensator device based on the first output power of the signal compensator device; and determining a difference between the determined input power of the signal compensator device and the target power.

Clause 10: The method of Clause 9, wherein determining the cable loss associated with the transmission cable is based on the difference between the determined input power of the signal compensator device and the target power.

Clause 11: The method of any of Clauses 8-10, further comprising, when the first output power of the signal compensator device is not greater than or equal to the minimum reliable output power: determining a second target gain value, the second target gain value is subject to a second maximum gain value greater than the first maximum gain value; and amplifying the input power of the signal compensator device according to the determined second target gain value to generate a second output power of the signal compensator device.

Clause 12: The method of Clause 11, wherein: the second target gain value is determined according to: (first target gain value−first output power)+target power.

Clause 13: The method of any of Clauses 11-12, further comprising, when second output power of the signal compensator device is greater than or equal to the minimum reliable output power: determining the input power of the signal compensator device based on the second output power of the signal compensator device; and determining a difference between the determined input power of the signal compensator device and the target power, wherein determining the cable loss associated with the transmission cable is based on the difference between the determined input power of the signal compensator device and the target power.

Clause 14: The method of any of Clauses 11-13, further comprising, when second output power of the signal compensator device is not greater than or equal to the minimum reliable output power, iteratively increasing the second target gain value until second output power of the signal compensator device is greater than or equal to the minimum reliable output power.

Clause 15: An apparatus, comprising: a memory comprising executable instructions; and one or more processors configured to execute the executable instructions and cause the apparatus to perform a method in accordance with any one of Clauses 1-14.

Clause 16: An apparatus, comprising means for performing a method in accordance with any one of Clauses 1-14.

Clause 17: A non-transitory computer-readable medium comprising executable instructions that, when executed by one or more processors of an apparatus, cause the apparatus to perform a method in accordance with any one of Clauses 1-14.

Clause 18: A computer program product embodied on a computer-readable storage medium comprising code for performing a method in accordance with any one of Clauses 1-14.

Additional Wireless Communication Network Considerations

The techniques and methods described herein may be used for various wireless communications networks (or wireless wide area network (WWAN)) and radio access technologies (RATs). While aspects may be described herein using terminology commonly associated with 3G, 4G, and/or 5G (e.g., 5G new radio (NR)) wireless technologies, aspects of the present disclosure may likewise be applicable to other communication systems and standards not explicitly mentioned herein.

5G wireless communication networks may support various advanced wireless communication services, such as enhanced mobile broadband (eMBB), millimeter wave (mmWave), machine type communications (MTC), and/or mission critical targeting ultra-reliable, low-latency communications (URLLC). These services, and others, may include latency and reliability requirements.

Returning to FIG. 1, various aspects of the present disclosure may be performed within the example wireless communications network 100.

In 3GPP, the term "cell" can refer to a coverage area of a NodeB and/or a narrowband subsystem serving this coverage area, depending on the context in which the term is used. In NR systems, the term "cell" and BS, next generation NodeB (gNB or gNodeB), access point (AP), distributed unit (DU), carrier, or transmission reception point may be used interchangeably. A BS may provide communication coverage for a macro cell, a pico cell, a femto cell, and/or other types of cells.

A macro cell may generally cover a relatively large geographic area (e.g., several kilometers in radius) and may allow unrestricted access by UEs with service subscription. A pico cell may cover a relatively small geographic area (e.g., a sports stadium) and may allow unrestricted access by UEs with service subscription. A femto cell may cover a relatively small geographic area (e.g., a home) and may allow restricted access by UEs having an association with the femto cell (e.g., UEs in a Closed Subscriber Group (C5G) and UEs for users in the home). A BS for a macro cell may be referred to as a macro BS. A BS for a pico cell may be referred to as a pico BS. A BS for a femto cell may be referred to as a femto BS, home BS, or a home NodeB.

Wireless devices 102 configured for 4G LTE (collectively referred to as Evolved Universal Mobile Telecommunications System (UMTS) Terrestrial Radio Access Network (E-UTRAN)) may interface with the EPC 160 through first backhaul links 132 (e.g., an S1 interface). Wireless devices 102 configured for 5G (e.g., 5G NR or Next Generation RAN (NG-RAN)) may interface with 5GC 190 through second backhaul links 184. Wireless devices 102 may communicate directly or indirectly (e.g., through the EPC 160 or 5GC 190) with each other over third backhaul links 134 (e.g., X2 interface). Third backhaul links 134 may generally be wired or wireless.

Small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. Small cell 102', employing NR in an unlicensed frequency spectrum, may boost coverage to and/or increase capacity of the access network.

Some base stations, such as BS 180 (e.g., gNB) may operate in a traditional sub-6 GHz spectrum, in millimeter wave (mmWave) frequencies, and/or near mmWave frequencies in communication with the UE 104. When the BS 180 operates in mmWave or near mmWave frequencies, the BS 180 may be referred to as an mmWave base station.

The communication links 120 between wireless devices 102 and, for example, UEs 104, may be through one or more carriers. For example, wireless devices 102 and UEs 104 may use spectrum up to Y MHz (e.g., 5, 10, 15, 20, 100, 400, and other MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Wireless communications system 100 further includes a Wi-Fi access point (AP) 150 in communication with Wi-Fi stations (STAs) 152 via communication links 154 in, for example, a 2.4 GHz and/or 5 GHz unlicensed frequency spectrum. When communicating in an unlicensed frequency spectrum, the STAs 152/AP 150 may perform a clear channel assessment (CCA) prior to communicating in order to determine whether the channel is available.

Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSBCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, 4G LTE), or 5G (e.g., NR), to name a few options.

EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. MME 162 may be in communication with a Home Subscriber Server (HSS) 174. MME 162 is the control node that processes the signaling between the UEs 104 and the EPC 160. Generally, MME 162 provides bearer and connection management.

Generally, user Internet protocol (IP) packets are transferred through Serving Gateway 166, which itself is connected to PDN Gateway 172. PDN Gateway 172 provides UE IP address allocation as well as other functions. PDN Gateway 172 and the BM-SC 170 are connected to the IP Services 176, which may include, for example, the Internet, an intranet, an IP Multimedia Subsystem (IMS), a PS Streaming Service, and/or other IP services.

BM-SC 170 may provide functions for MBMS user service provisioning and delivery. BM-SC 170 may serve as an entry point for content provider IVIBMS transmission, may be used to authorize and initiate MBMS Bearer Services within a public land mobile network (PLMN), and may be used to schedule MBMS transmissions. MBMS Gateway 168 may be used to distribute MBMS traffic to the wireless devices 102 belonging to a Multicast Broadcast Single Frequency Network (MBSFN) area broadcasting a particular service, and may be responsible for session management (start/stop) and for collecting eMBMS related charging information.

5GC 190 may include an Access and Mobility Management Function (AMF) 192, other AMFs 193, a Session Management Function (SMF) 194, and a User Plane Function (UPF) 195. AMF 192 may be in communication with a Unified Data Management (UDM) 196.

AMF 192 is generally the control node that processes the signaling between UEs 104 and 5GC 190. Generally, AMF 192 provides QoS flow and session management.

All user Internet protocol (IP) packets are transferred through UPF 195, which is connected to the IP Services 197, and which provides UE IP address allocation as well as other functions for 5GC 190. IP Services 197 may include, for example, the Internet, an intranet, an IP Multimedia Subsystem (IMS), a PS Streaming Service, and/or other IP services.

Returning to FIG. 2, various example components of wireless device 201 and UE 104 (e.g., the wireless communication network 100 of FIG. 1) are depicted, which may be used to implement aspects of the present disclosure.

At wireless device 201, a transmit processor 220 may receive data from a data source 212 and control information from a controller/processor 240. The control information may be for the physical broadcast channel (PBCH), physical control format indicator channel (PCFICH), physical hybrid ARQ indicator channel (PHICH), physical downlink control channel (PDCCH), group common PDCCH (GC PDCCH), and others. The data may be for the physical downlink shared channel (PDSCH), in some examples.

A medium access control (MAC)-control element (MAC-CE) is a MAC layer communication structure that may be used for control command exchange between wireless nodes. The MAC-CE may be carried in a shared channel such as a physical downlink shared channel (PDSCH), a physical uplink shared channel (PUSCH), or a physical sidelink shared channel (PSSCH).

Processor 220 may process (e.g., encode and symbol map) the data and control information to obtain data symbols and control symbols, respectively. Transmit processor 220 may also generate reference symbols, such as for the primary synchronization signal (PSS), secondary synchronization signal (SSS), PBCH demodulation reference signal (DMRS), and channel state information reference signal (CSI-RS).

Transmit (TX) multiple-input multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream (e.g., for OFDM) to obtain an output sample stream. Each modulator may further process (e.g., convert to analog, amplify, filter, and upconvert) the output sample stream to obtain a downlink signal. Downlink signals from the modulators in transceivers 232a-232t may be transmitted via the antennas 234a-234t, respectively.

At UE 104, antennas 252a-252r may receive the downlink signals from the wireless device 201 and may provide received signals to the demodulators (DEMODs) in transceivers 254a-254r, respectively. Each demodulator in transceivers 254a-254r may condition (e.g., filter, amplify, downconvert, and digitize) a respective received signal to obtain input samples. Each demodulator may further process the input samples (e.g., for OFDM) to obtain received symbols.

MIMO detector 256 may obtain received symbols from all the demodulators in transceivers 254a-254r, perform MIMO detection on the received symbols if applicable, and provide detected symbols. Receive processor 258 may process (e.g., demodulate, deinterleave, and decode) the detected symbols, provide decoded data for the UE 104 to a data sink 260, and provide decoded control information to a controller/processor 280.

On the uplink, at UE 104, transmit processor 264 may receive and process data (e.g., for the physical uplink shared channel (PUSCH)) from a data source 262 and control information (e.g., for the physical uplink control channel (PUSCH)) from the controller/processor 280. Transmit processor 264 may also generate reference symbols for a reference signal (e.g., for the sounding reference signal (SRS)). The symbols from the transmit processor 264 may be precoded by a TX MIMO processor 266 if applicable, further processed by the modulators in transceivers 254a-254r (e.g., for SC-FDM), and transmitted to wireless device 201.

At wireless device 201, the uplink signals from UE 104 may be received by antennas 234a-t, processed by the demodulators in transceivers 232a-232t, detected by a IMMO detector 236 if applicable, and further processed by a receive processor 238 to obtain decoded data and control information sent by UE 104. Receive processor 238 may provide the decoded data to a data sink 239 and the decoded control information to the controller/processor 240.

Memories 242 and 282 may store data and program codes for wireless device 201 and UE 104, respectively.

Scheduler 244 may schedule UEs for data transmission on the downlink and/or uplink.

5G may utilize orthogonal frequency division multiplexing (OFDM) with a cyclic prefix (CP) on the uplink and downlink. 5G may also support half-duplex operation using time division duplexing (TDD). OFDM and single-carrier frequency division multiplexing (SC-FDM) partition the system bandwidth into multiple orthogonal subcarriers, which are also commonly referred to as tones and bins. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The minimum resource allocation, called a resource block (RB), may be 12 consecutive subcarriers in some examples. The system bandwidth may also be partitioned into subbands. For example, a subband may cover multiple RBs. NR may support a base subcarrier spacing (SCS) of 15 KHz and other SCS may be defined with respect to the base SCS (e.g., 30 kHz, 60 kHz, 120 kHz, 240 kHz, and others).

Additional Considerations

The preceding description provides examples of determining a cable loss associated with the transmission cable of an apparatus. The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the generic principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The techniques described herein may be used for various wireless communication technologies, such as 5G (e.g., 5G NR), 3GPP Long Term Evolution (LTE), LTE-Advanced (LTE-A), code division multiple access (CDMA), time division multiple access (TDMA), frequency division multiple access (FDMA), orthogonal frequency division multiple access (OFDMA), single-carrier frequency division multiple access (SC-FDMA), time division synchronous code division multiple access (TD-SCDMA), and other networks. The terms "network" and "system" are often used interchangeably. A CDMA network may implement a radio technology such as Universal Terrestrial Radio Access (UTRA), cdma2000, and others. UTRA includes Wideband. CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, and others. UTRA and E-UTRA are part of Universal Mobile Telecommunication System (UMTS). LTE and LTE-A are releases of UMTS that use E-UTRA. UTRA, E-UTRA, UNITS, LTE, LTE-A and GSM are described in documents from an organization named "3rd Generation Partnership Project" (3GPP). cdma2000 and UMB are described in documents from an organization named "3rd Generation Partnership Project 2" (3GPP2). NR is an emerging wireless communications technology under development.

The various illustrative logical blocks, modules and circuits described in connection with the present disclosure may be implemented or performed with a general purpose processor, a DSP, an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, a system on a chip (SoC), or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user equipment (see FIG. 1), a user interface (e.g., keypad, display, mouse, joystick, touchscreen, biometric sensor, proximity sensor, light emitting element, and others) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, h, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A method for determining cable loss performed by a signal compensator device of an apparatus, comprising:
    sending, to a radio modem of the apparatus, a request for the radio modem to use a target power when sending one or more signals to the signal compensator device for determining a cable loss associated with a transmission cable communicatively coupling the radio modem with the signal compensator device;
    receiving, at the signal compensator device, the one or more signals from the radio modem sent using the target power, wherein:
        the one or more signals are received by the signal compensator device at an input power, and
        the input power comprises the target power reduced according to the cable loss associated with the transmission cable;
    determining a first target gain value for amplifying the input power of the signal compensator device, wherein the first target gain value is subject to a first maximum gain value;
    amplifying the input power of the one or more signals received at the signal compensator device according to the determined first target gain value to generate a first output power of the signal compensator device;
    determining whether the first output power of the signal compensator device is greater than or equal to a minimum output power;
    determining, when the first output power of the signal compensator device is not greater than or equal to the minimum output power, a second target gain value for amplifying the input power of the signal compensator device, wherein the second target gain value is subject to a second maximum gain value greater than the first maximum gain value;
    amplifying, when the first output power of the signal compensator device is not greater than or equal to the minimum output power, the input power of the one or more signals received at the signal compensator device according to the determined second target gain value to generate a second output power of the signal compensator device; and
    determining the cable loss associated with the transmission cable based on the one or more signals.

2. The method of claim 1, wherein the target power is less than or equal to a lowest transmission power specified by an additional maximum power reduction (A-MPR) requirement associated with a particular geographical region.

3. The method of claim 2, wherein the particular geographic region comprises Europe.

4. The method of claim 2, wherein the A-MPR requirement is related to vehicle-to-everything (V2X) communications.

5. The method of claim 2, wherein the target power that is less than or equal to a lowest transmission power specified by the A-MPR requirement depends on a peak antenna gain of an antenna of the signal compensator device.

6. The method of claim 1, further comprising, when the first output power of the signal compensator device is greater than or equal to the minimum output power:
    determining the input power of the signal compensator device based on the first output power of the signal compensator device; and
    determining a difference between the determined input power of the signal compensator device and the target power.

7. The method of claim 6, wherein determining the cable loss associated with the transmission cable is based on the difference between the determined input power of the signal compensator device and the target power.

8. The method of claim 1, wherein:
    the second target gain value is determined according to: (first target gain value−first output power)+target power.

9. The method of claim 1, further comprising, when second output power of the signal compensator device is greater than or equal to the minimum output power:
    determining the input power of the signal compensator device based on the second output power of the signal compensator device; and
    determining a difference between the determined input power of the signal compensator device and the target power, wherein determining the cable loss associated with the transmission cable is based on the difference between the determined input power of the signal compensator device and the target power.

10. The method of claim 1, further comprising, when second output power of the signal compensator device is not greater than or equal to the minimum output power, iteratively increasing the second target gain value until second output power of the signal compensator device is greater than or equal to the minimum output power.

11. An apparatus for determining cable loss, comprising:
memory comprising executable instructions; and
one or more processors configured to execute the executable instructions and cause the apparatus to:
send, to a modem of the apparatus, a request for the modem to use a target power when sending one or more signals to a signal compensator device of the apparatus for determining a cable loss associated with a transmission cable communicatively coupling the modem with the signal compensator device;
receive, at the signal compensator device, the one or more signals from the modem sent using the target power, wherein:
the one or more signals are received by the signal compensator device at an input power, and
the input power comprises the target power reduced according to the cable loss associated with the transmission cable;
determine a first target gain value for amplifying the input power of the signal compensator device, wherein the first target gain value is subject to a first maximum gain value;
amplify the input power of the one or more signals received at the signal compensator device according to the determined first target gain value to generate a first output power of the signal compensator device;
determine whether the first output power of the signal compensator device is greater than or equal to a minimum output power;
determine, when the first output power of the signal compensator device is not greater than or equal to the minimum output power, a second target gain value for amplifying the input power of the signal compensator device, wherein the second target gain value is subject to a second maximum gain value greater than the first maximum gain value;
amplify, when the first output power of the signal compensator device is not greater than or equal to the minimum output power, the input power of the one or more signals received at the signal compensator device according to the determined second target gain value to generate a second output power of the signal compensator device; and
determine the cable loss associated with the transmission cable based on the one or more signals.

12. The apparatus of claim 11, wherein the target power is less than or equal to a lowest transmission power specified by an additional maximum power reduction (A-MPR) requirement associated with a particular geographical region.

13. The apparatus of claim 12, wherein the particular geographic region comprises Europe.

14. The apparatus of claim 12, wherein the A-MPR requirement is related to vehicle-to-everything (V2X) communications.

15. The apparatus of claim 12, wherein the target power that is less than or equal to a lowest transmission power specified by the A-MPR requirement depends on a peak antenna gain of an antenna of the signal compensator device.

16. The apparatus of claim 1, wherein the one or more processors are further configured to cause the apparatus to:
when the first output power of the signal compensator device is greater than or equal to the minimum output power:
determine the input power of the signal compensator device based on the first output power of the signal compensator device; and
determine a difference between the determined input power of the signal compensator device and the target power.

17. The apparatus of claim 16, wherein the one or more processors are configured to cause the apparatus to determine the cable loss associated with the transmission cable based on the difference between the determined input power of the signal compensator device and the target power.

18. The apparatus of claim 11, wherein the second target gain value is determined according to: (first target gain value−first output power)+target power.

19. The apparatus of claim 11, wherein the one or more processors are further configured to cause the apparatus to:
when second output power of the signal compensator device is greater than or equal to the minimum output power:
determine the input power of the signal compensator device based on the second output power of the signal compensator device; and
determine a difference between the determined input power of the signal compensator device and the target power, wherein determining the cable loss associated with the transmission cable is based on the difference between the determined input power of the signal compensator device and the target power.

20. The apparatus of claim 11, wherein the one or more processors are further configured to cause the apparatus to, when second output power of the signal compensator device is not greater than or equal to the minimum output power, iteratively increasing the second target gain value until second output power of the signal compensator device is greater than or equal to the minimum output power.

21. An apparatus for determining cable loss, comprising:
means for sending, to a radio modem of the apparatus, a request for the radio modem to use a target power when sending one or more signals to a signal compensator device of the apparatus for determining a cable loss associated with a transmission cable communicatively coupling the radio modem with the signal compensator device;
means for receiving, at the signal compensator device, the one or more signals from the radio modem sent using the target power, wherein:
the one or more signals are received by the signal compensator device at an input power, and
the input power comprises the target power reduced according to the cable loss associated with the transmission cable; and
means for determining a first target gain value for amplifying the input power of the signal compensator device, wherein the first target gain value is subject to a first maximum gain value;
means for amplifying the input power of the one or more signals received at the signal compensator device according to the determined first target gain value to generate a first output power of the signal compensator device;

means for determining whether the first output power of the signal compensator device is greater than or equal to a minimum output power;

means for determining, when the first output power of the signal compensator device is not greater than or equal to the minimum output power, a second target gain value for amplifying the input power of the signal compensator device, wherein the second target gain value is subject to a second maximum gain value greater than the first maximum gain value;

means for amplifying, when the first output power of the signal compensator device is not greater than or equal to the minimum output power, the input power of the one or more signals received at the signal compensator device according to the determined second target gain value to generate a second output power of the signal compensator device; and means for determining the cable loss associated with the transmission cable based on the one or more signals.

22. A non-transitory computer-readable medium for determining a cable loss, comprising:

executable instructions that, when executed by one or more processors of an apparatus, cause the apparatus to:

send, to a modem of the apparatus, a request for the modem to use a target power when sending one or more signals to a signal compensator device of the apparatus for determining a cable loss associated with a transmission cable communicatively coupling the modem with the signal compensator device;

receive, at the signal compensator device, the one or more signals from the modem sent using the target power, wherein:

the one or more signals are received by the signal compensator device at an input power, and the input power comprises the target power reduced according to the cable loss associated with the transmission cable;

determine a first target gain value for amplifying the input power of the signal compensator device, wherein the first target gain value is subject to a first maximum gain value;

amplify the input power of the one or more signals received at the signal compensator device according to the determined first target gain value to generate a first output power of the signal compensator device;

determine whether the first output power of the signal compensator device is greater than or equal to a minimum output power;

determine, when the first output power of the signal compensator device is not greater than or equal to the minimum output power, a second target gain value for amplifying the input power of the signal compensator device, wherein the second target gain value is subject to a second maximum gain value greater than the first maximum gain value;

amplify, when the first output power of the signal compensator device is not greater than or equal to the minimum output power, the input power of the one or more signals received at the signal compensator device according to the determined second target gain value to generate a second output power of the signal compensator device; and determine the cable loss associated with the transmission cable based on the one or more signals.

\* \* \* \* \*